(12) United States Patent
Suzuki

(10) Patent No.: US 8,319,874 B2
(45) Date of Patent: Nov. 27, 2012

(54) CONNECTION/SEPARATION ELEMENT IN PHOTOELECTRIC CONVERTER PORTION, SOLID-STATE IMAGING DEVICE, AND IMAGING APPARATUS

(75) Inventor: Satoshi Suzuki, Tokyo (JP)

(73) Assignee: Nikon Corporation, Tokyo (JP)

( * ) Notice: Subject to any disclaimer, the term of this patent is extended or adjusted under 35 U.S.C. 154(b) by 429 days.

(21) Appl. No.: 12/534,728

(22) Filed: Aug. 3, 2009

(65) Prior Publication Data
US 2009/0290059 A1 Nov. 26, 2009

Related U.S. Application Data

(63) Continuation of application No. PCT/JP2008/051994, filed on Jan. 31, 2008.

(30) Foreign Application Priority Data

Feb. 6, 2007 (JP) .................................. 2007-027353

(51) Int. Cl.
*H04N 5/335* (2011.01)
(52) U.S. Cl. ........................................................ 348/308
(58) Field of Classification Search .................. 348/275, 348/281, 302, 307, 308; 257/222, 223, 333
See application file for complete search history.

(56) References Cited

U.S. PATENT DOCUMENTS

| 4,644,402 A * | 2/1987 | Yamada ........................ 348/307 |
| 6,091,793 A | 7/2000 | Kamashita |
| 6,819,360 B1 | 11/2004 | Ide et al. |
| 7,745,857 B2 * | 6/2010 | Okumura et al. ............. 257/292 |
| 2002/0121652 A1 * | 9/2002 | Yamasaki ...................... 257/222 |
| 2004/0051801 A1 | 3/2004 | Iizuka et al. |
| 2006/0001751 A1 * | 1/2006 | Abe et al. ...................... 348/300 |
| 2006/0181627 A1 * | 8/2006 | Farrier ........................... 348/308 |
| 2007/0152291 A1 * | 7/2007 | Lim ............................... 257/461 |
| 2007/0154200 A1 * | 7/2007 | Utagawa et al. .............. 396/111 |

FOREIGN PATENT DOCUMENTS

| JP | 62-030385 A | 9/1987 |
| JP | 02-072678 A | 12/1990 |
| JP | 05-207376 A | 8/1993 |
| JP | 11-177076 A | 7/1999 |
| JP | 2000-292686 A | 10/2000 |
| JP | 2002-165126 A | 6/2002 |
| JP | 2003-244712 A | 8/2003 |

(Continued)

OTHER PUBLICATIONS

Office Action issued Sep. 20, 2011 in Japanese Patent Application No. 2007-027353.
Office Action issued Feb. 7, 2012 in Japanese Patent Application No. 2007-027353.
U.S. Appl. No. 12/326,884, filed Dec. 2, 2008.

*Primary Examiner* — Tuan Ho
(74) *Attorney, Agent, or Firm* — Miles & Stockbridge P.C.

(57) ABSTRACT

Suppressing a fall in sensitivity upon shooting without causing similar effect as a pixel defect in spite of being able to perform focal point detection. When a gate electrode 67 is high, pinned photodiodes 41, 42 are electrically connected with each other. At this moment, a lower area of the gate electrode 67 has a photoelectric conversion function. On the other hand, when the gate electrode 67 is low, pinned photodiodes 41, 42 are electrically separated with each other. At this moment, the lower area of the gate electrode 67 does not have any photoelectric conversion function.

13 Claims, 18 Drawing Sheets

FOREIGN PATENT DOCUMENTS

| | | |
|---|---|---|
| JP | 2004-111590 A | 4/2004 |
| JP | 2004-309310 A | 4/2004 |
| JP | 2004-319837 A | 11/2004 |
| JP | 2004-335882 A | 11/2004 |

* cited by examiner

CONNECTION/SEPARATION ELEMENT IN PHOTOELECTRIC CONVERTER PORTION, SOLID-STATE IMAGING DEVICE, AND IMAGING APPARATUS

CROSS-REFERENCE TO RELATED APPLICATION

This application is a continuation of International Application No. PCT/JP2008/051994 filed Jan. 31, 2008.

TECHNICAL FIELD

The present invention relates to a connection/separation element in a photoelectric converter portion, a solid-state imaging device and an imaging apparatus using the photoelectric converter portion.

BACKGROUND ART

Recently, an imaging apparatus such as a video camera and an electronic still camera has widely spread. In each of these cameras, a solid-state imaging device such as a CCD type and an amplification type is used. In such a solid-state imaging device, a plurality of pixels having a photoelectric converter portion for generating a signal charge in accordance with an amount of incident light are formed in a grid shape.

In an amplification type solid-state imaging device, a signal charge generated and accumulated by the photoelectric converter portion in a pixel is led to an amplifying portion, and a signal amplified by the amplifying portion is output from the pixel.

In an amplification type solid-state imaging device, there is proposed, for example, a solid-state imaging device using a junction-field-effect transistor in the amplifying portion (see, for example, Japanese Patent Application Laid-Open Nos. 11-177076 and 2004-335882), and a CMOS type solid-state imaging device using an MOS transistor in the amplifying portion (see, for example, Japanese Patent Application Laid-Open No. 2004-111590).

In the conventional solid-state imaging devices disclosed in Japanese Patent Application Laid-Open Nos. 11-177076, 2004-335882 and 2004-111590, a photoelectric converter portion, an amplifying portion, and a charge-storing portion for temporally storing the charge between them are disposed in each pixel. Moreover, in the conventional solid-state imaging devices, after exposing all pixels at the same time, the signal charge generated in each photoelectric converter portion is transferred to each charge-storing portion at the same time over all pixels and temporally stored, and the signal charge is successively converted into pixel signal with a prescribed readout timing. Accordingly, it becomes possible to prevent image deformation caused by difference in exposure time of respective pixels between lines upon carrying out electronic shutter movement, which is a so-called rolling shutter.

In an imaging apparatus such as a camera, in order to realize automatic focusing control, it is necessary to detect a focal point adjusting state of an image-taking lens. Previously, a focal point detecting device was provided separately from a solid-state imaging device. However, in this case, cost increased and the apparatus became large by just the amount of the focal point detecting device and the focal point detecting optical system.

Accordingly, there has been proposed a solid-state imaging device configured to be used as a focal point detector with using a so-called pupil division phase difference detection method (sometimes called as a pupil division method or a phase difference method) as a focal point detection method (see, for example, Japanese Patent Application Laid-Open No. 2003-244712). The pupil division phase difference detection method is a method for detecting a defocusing amount of an image-taking lens such that a bundle of rays passing through the image-taking lens is divided into two at pupil to form a pair of divided images, and difference in the images, which is the amount of phase shift, is detected.

In the solid-state imaging device disclosed in Japanese Patent Application Laid-Open No. 2003-244712, a plurality of pixels having bisected photoelectric converter portions are provided. A floating diffusion is provided between one of the bisected photoelectric converter portion and the other of the bisected photoelectric converter portion, and the photoelectric converter portion is bisected by the floating diffusion. A micro-lens is provided on such photoelectric converter portions with one-to-one correspondence to each pixel. The bisected photoelectric converter portion is disposed substantially an imaging relation (conjugate relation) to the exit pupil of the image-taking lens by the micro-lens. Accordingly, since the distance between the exit pupil of the image-taking lens and the micro-lens is sufficiently larger than the dimension of the micro-lens, the bisected photoelectric converter portion is disposed substantially to the focal point of the micro-lens. In the relation described above, in each pixel, one of the bisected photoelectric converter portion selectively detects a bundle of rays passing through an area, which is a portion of the exit pupil of the image-taking lens, decentered in a given direction from the center of the exit pupil, and carries out photoelectric conversion. Moreover, in each pixel, the other of the bisected photoelectric converter portion selectively detects a bundle of rays passing through an area, which is a portion of the exit pupil of the image-taking lens, decentered in the opposite direction from the center of the exit pupil, and carries out photoelectric conversion.

In the solid-state imaging device disclosed in Japanese Patent Application Laid-Open No. 2003-244712, upon focal point detection, a signal from one of the bisected photoelectric converter portion of each pixel having the bisected photoelectric converter portion and a signal from the other of the bisected photoelectric converter portion are transferred to a floating diffusion with different timings, and red out separately. In accordance with a theory of the pupil division phase difference detection method, a state of focal point adjustment of the image-taking lens is detected on the basis of these signals. On the other hand, upon taking picture after focusing of the image-taking lens, signals from both of the bisected photoelectric converter portions are transferred to the floating diffusion at the same timing, and added in the pixel to be red out. Accordingly, since the pixel having the bisected photoelectric converter portion does not cause the same state as a defective pixel, it is excellent in view of enhancing imaging performance.

However, in the solid-state imaging device disclosed in Japanese Patent Application Laid-Open No. 2003-244712, as described above, a floating diffusion is provided between one of the bisected photoelectric converter portion and the other of the bisected photoelectric converter portion, and the photoelectric converter portion is bisected by the floating diffusion. Accordingly, since the central portion of the pixel where the incident light amount is concentrated does not have photoelectric sensitivity, when the pixel is used for taking picture upon taking picture, sensitivity of the pixel becomes low.

DISCLOSURE OF THE INVENTION

The present invention is made in view of the above-described problems and has an object to provide a solid-state imaging device capable of suppressing deterioration in sensitivity without causing the similar state of a defect pixel upon taking picture, and an imaging apparatus using thereof.

According to a first aspect of the present invention, there is provided a solid-state imaging device for photoelectrically converting an object image formed by an image-taking lens comprising: a plurality of pixels disposed two-dimensionally; at least a portion of pixels among the plurality of pixels including one photoelectric converter portion and the other photoelectric converter portion, each of which carries out photoelectric conversion and a mode setting member capable of selectively setting a first and second modes; the first mode being a mode that the one photoelectric converter portion and the other photoelectric converter portion are electrically connected with each other; the second mode being a mode that the one photoelectric converter portion and the other photoelectric converter portion are electrically separated; and an area between the one photoelectric converter portion and the other photoelectric converter portion having a function that photoelectrically converts incident light upon the first mode and not having the function upon the second mode.

In the first aspect of the present invention, it is preferable that the one photoelectric converter portion and the other photoelectric converter portion exist respectively in one area and in the other area divided by a dividing line in plan view in said at least a portion of pixels, and the mode setting member includes a gate electrodes disposed along the dividing line.

In the first aspect of the present invention, it is preferable that the gate electrode constructs a gate of an MOS transistor that makes a semiconductor area of the one photoelectric converter portion and a semiconductor area of the other photoelectric converter portion as a source or a drain.

In the first aspect of the present invention, it is preferable that the gate electrode does not intrude in an area between opposite surfaces of the one photoelectric converter portion and the other photoelectric converter portion.

In the first aspect of the present invention, it is preferable that the gate electrode intrudes in an area between opposite surfaces of the one photoelectric converter portion and the other photoelectric converter portion.

In the first aspect of the present invention, it is preferable that the gate electrode is constructed by a material having transparency to at least one wavelength range among visible light.

In the first aspect of the present invention, it is preferable that the gate electrode is constructed by ITO or polysilicon.

In the first aspect of the present invention, it is preferable that a micro-lens for leading light to the one photoelectric converter portion and the other photoelectric converter portion is provided to each of at least a portion of pixels with one-to-one correspondence.

According to a second aspect of the present invention, there is provided a solid-state imaging device for photoelectrically converting an object image formed by an image-taking lens comprising:

a plurality of pixels disposed two-dimensionally;

at least a portion of pixels among the plurality of pixels including a first and a second photoelectric converter portions and a gate for electrically connecting or separating said first and said second photoelectric converter portions.

According to a third aspect of the present invention, there is provided an imaging apparatus comprising: the solid-state imaging device according to the first aspect; a signal processor for outputting detection signal indicating focal point adjustment state of the image-taking lens on the basis of signals obtained in the second mode from each of selected pixels among at least one portion of pixels; and a lens controller for controlling focal point adjustment of the image-taking lens on the basis of the detection signal from the signal processor.

According to a fourth aspect of the present invention, there is provided a connection/separation element of a photoelectric converter comprising: one photoelectric converter portion existing in one area and the other photoelectric converter portion existing in the other area divided by a dividing line in plan view and each of which carries out photoelectric conversion; and a mode setting member capable of selectively setting a first and a second modes; the first mode being a mode that the one the photoelectric converter portion and the other photoelectric converter portion are electrically connected with each other; the second mode being a mode that the one photoelectric converter portion and the other photoelectric converter portion are electrically separated; and an area between the one photoelectric converter portion and the other photoelectric converter portion having a function that photoelectrically converts incident light upon the first mode and not having the function upon the second mode.

According to the present invention, it becomes possible to provide a solid-state imaging device capable of suppressing deterioration in sensitivity without causing the similar state of a defect pixel upon taking picture, and an imaging apparatus using thereof.

Moreover, according to the present invention, it becomes possible to provide a connection/separation element of a photoelectric converter portion capable of using for a solid-state imaging device.

THE BEST MODE FOR CARRYING OUT THE INVENTION

A connection/separation element of a photoelectric converter portion, and a solid-state imaging device and an imaging apparatus using the same according to the present invention are explained below with reference to accompanying drawings.

[First Embodiment]

Figure 1:
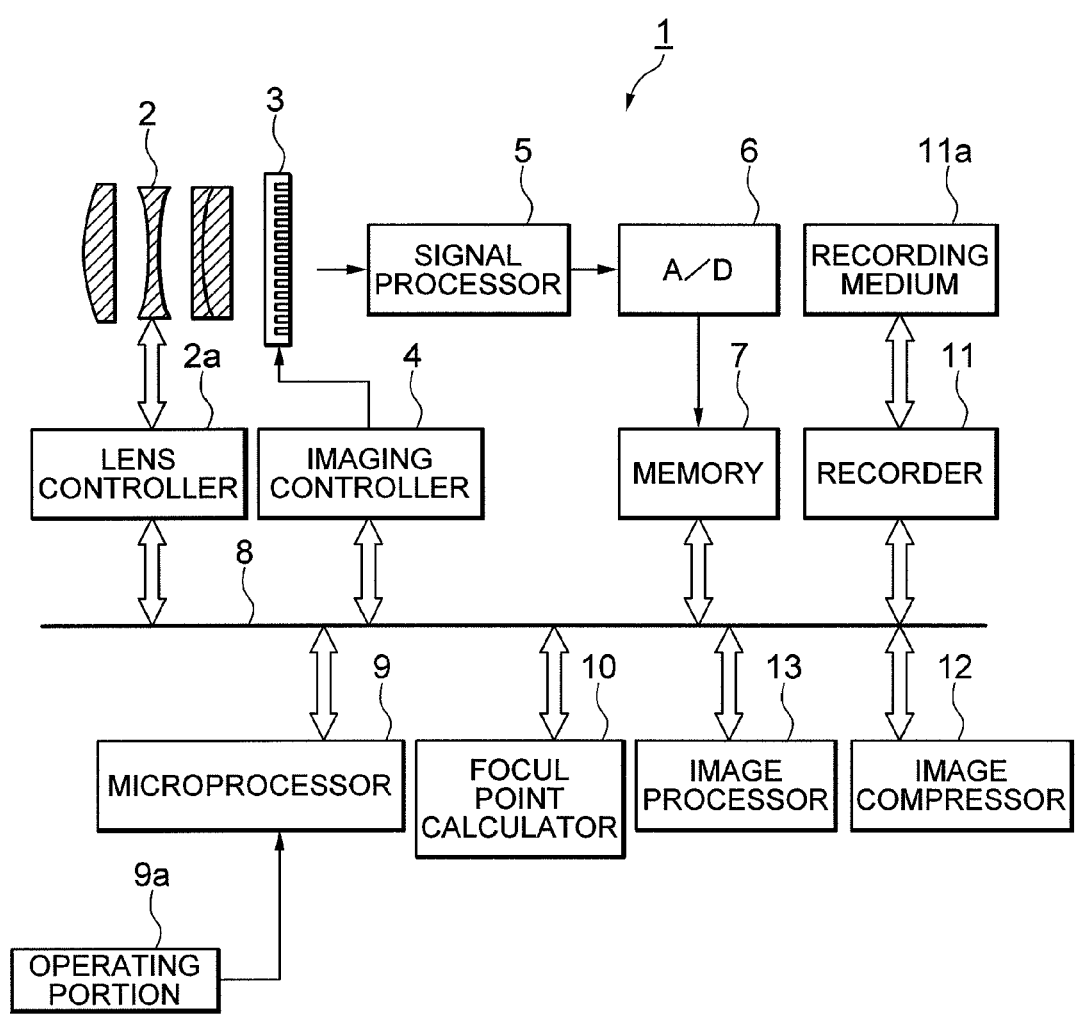
FIG. 1 is a block diagram showing an electronic camera according to a first embodiment of the present invention.

FIG. 1 is a block diagram showing an electronic camera 1 as an imaging apparatus according to a first embodiment of the present invention. The electronic camera 1 is equipped with an image-taking lens 2. The image-taking lens 2 is controlled by a lens controller 2a upon focusing and stopping down of an aperture stop. An imaging surface of a solid-state imaging device 3 for performing photoelectric conversion of an object image formed by the image-taking lens 2 is disposed in the image side space of the image-taking lens 2.

The solid-state imaging device 3 is driven by an instruction of an imaging controller 4 and outputs a signal. The signal output from the solid-state imaging device 3 is either an imaging signal for forming an image signal showing the object image or a focal point detection signal for detecting focal point adjusting state of the image-taking lens 2. Either way a signal is processed by a signal processor 5 and an A/D converter 6, and stored temporarily in a memory 7. The memory 7 is connected to a data bus 8. The data bus 8 is connected with the lens controller 2a, the imaging controller 4, a microprocessor 9, a focal point calculator (detection processor) 10, a recorder 11, an image compressor 12, and an image processor 13. The microprocessor 9 is connected with an operating portion 9a such as a release button. The recorder 11 is removably connected with a recording medium 11a. Operation of the electronic camera 1 is going to be explained later.

Figure 2:
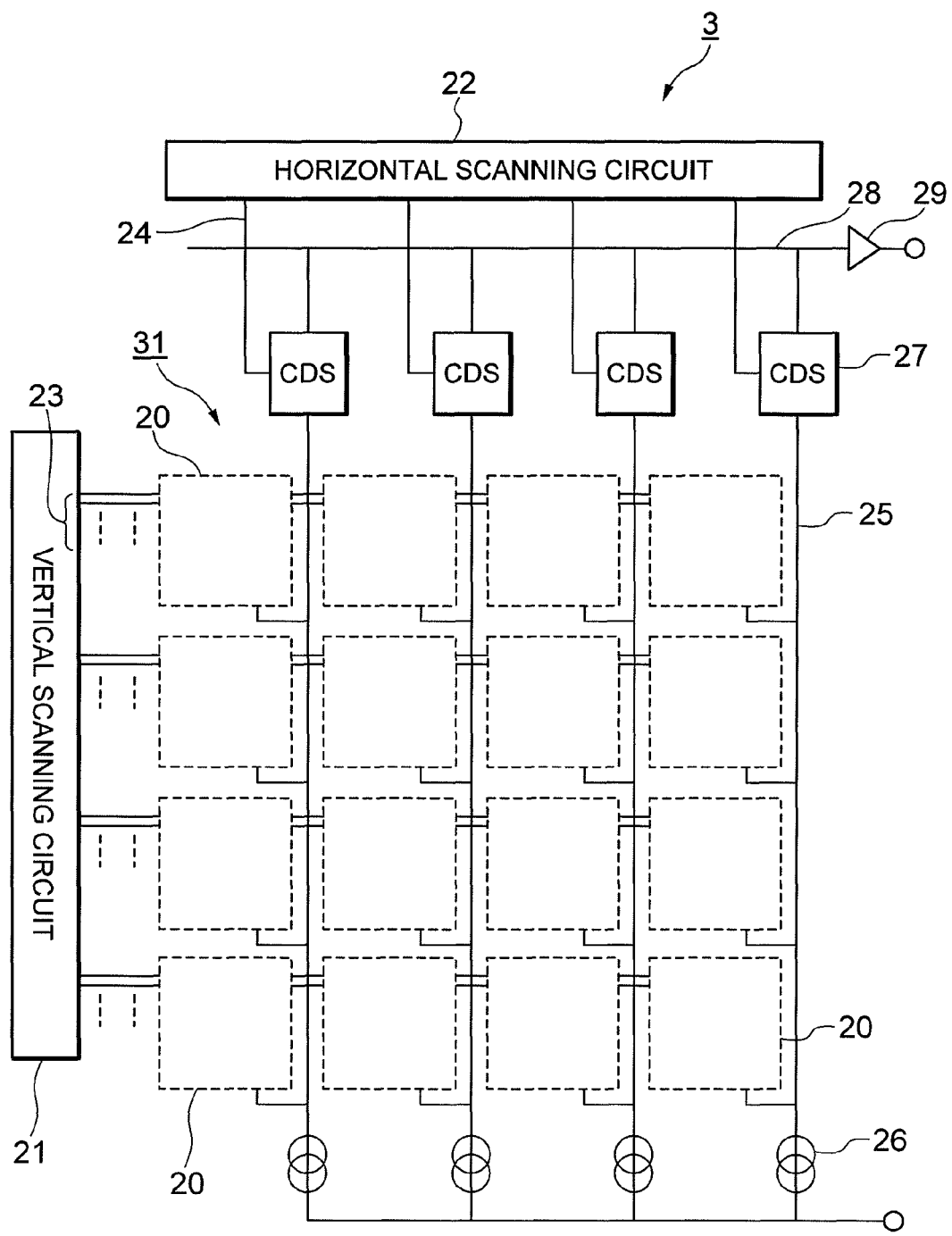
FIG. 2 is a circuit diagram showing broad configuration of a solid-state imaging device shown in FIG. 1.

FIG. 2 is a circuit diagram showing broad configuration of a solid-state imaging device 3 shown in FIG. 1. The solid-state imaging device 3 has a plurality of pixels 20 formed in a grid shape and peripheral circuitry for outputting a signal from the pixel 20. Symbol 31 shows an imaging area where pixels are disposed in a grid shape. In FIG. 2, the number of pixels is 16 that is four rows horizontally and four columns vertically. However, in the present embodiment, the number of pixels is a great deal larger. In the present invention, it is needless to say that the number of pixels is not limited to this.

In the present embodiment, although the solid-state imaging device 3 includes three kinds of pixels 20V, 20H, and 20N explained later, they are denoted by a symbol 20 in FIG. 2 without making distinction between them. Specific configuration and circuitry of the pixels are explained later. The pixel 20 outputs either an imaging signal or a focal point detection signal in accordance with a drive signal from peripheral circuitry. Moreover, the whole pixels can be reset their photoelectric converter portions at the same time, so that exposure time and timing thereof can be made the same.

Peripheral circuitry is composed of a vertical scanning circuit 21, a horizontal scanning circuit 22, drive signal lines 23 and 24 connected thereto, a vertical signal line 25 for receiving signals from pixels 20, a constant-current power supply 26 for connecting to the vertical signal line 25, a correlation double sampling circuit (CDS) 27, a horizontal signal line 28 for receiving signal output from the correlation double sampling circuit 27, an output amplifier 29, and the like.

The vertical scanning circuit 21 and the horizontal scanning circuit 22 output a driving signal on the basis of an instruction from the imaging controller 4 of the electronic camera 1. Each pixel receives the driving signal output from the vertical scanning circuit 21 through the drive signal line 23, and is driven, and outputs the imaging signal or the focal point detection signal to the vertical signal line 25. The vertical scanning circuit 21 outputs a plurality of drive signals. Accordingly, a plurality of drive signal lines 23 are there. This is explained later.

The signal output from the pixel 20 is carried out predetermined noise reduction by the CDS circuit 27, and output in accordance with driving signal from the horizontal scanning circuit 22 through the horizontal signal line 28 and the output amplifier 29.

Figure 3:
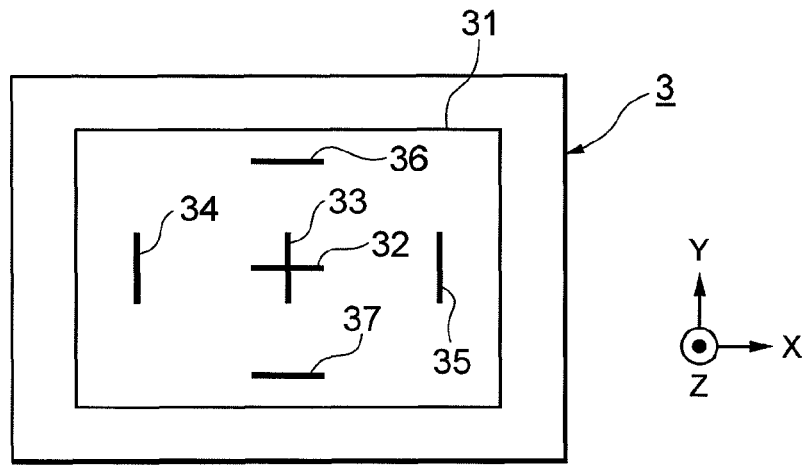
FIG. 3 is a plan view schematically showing the solid-state imaging device shown in FIG. 1.

FIG. 3 is a plan view schematically showing the solid-state imaging device 3 shown in FIG. 1, in particular, the imaging area 31 thereof. As shown in FIG. 3, in the present embodiment, two focal point detection areas 32, 33 disposed at the center forming a cross shape, two focal point detection areas 34, 35 disposed at both sides, and two focal point detection areas 36, 37 disposed at upper side and lower side are disposed in the imaging area 31 of the solid-state imaging device 3. Mutually orthogonal X-axis, Y-axis, and Z-axis are defined as shown in FIG. 3. In X-axis direction, the arrow is called as +X direction or +X side, and the opposite direction is called as −X direction or −X side, and the same goes for the Y-axis direction. A plane parallel to the XY plane is corresponding to the imaging surface, in other words, a photosensitive surface of the solid-state imaging device 3. Pixels in X-axis direction is called as a row, and those in Y-axis direction is called as a column. Incident light in FIG. 3 is incident from this side to the other side of the surface of the figure. This is the same in the following figures. In the present specification, X-axis direction is the right-and-left direction, +X side is the right side, −X side is the left side, Y-axis direction is the upper-and-lower direction, +Y side is the upper side, and −Y side is the lower side.

Figure 4:
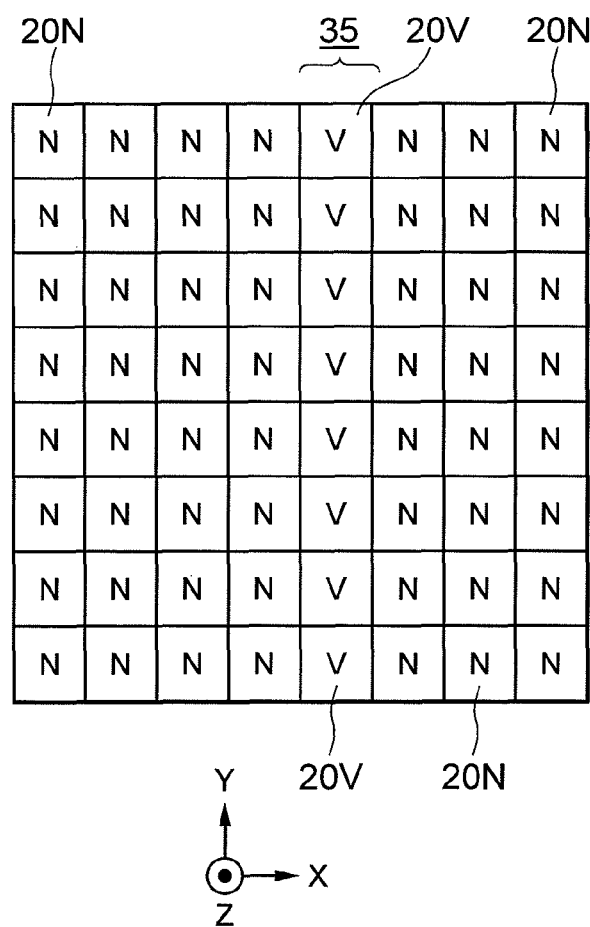
FIG. 4 is an enlarged view enlarging in the vicinity of a given focal point detection area shown in FIG. 3.
Figure 5:
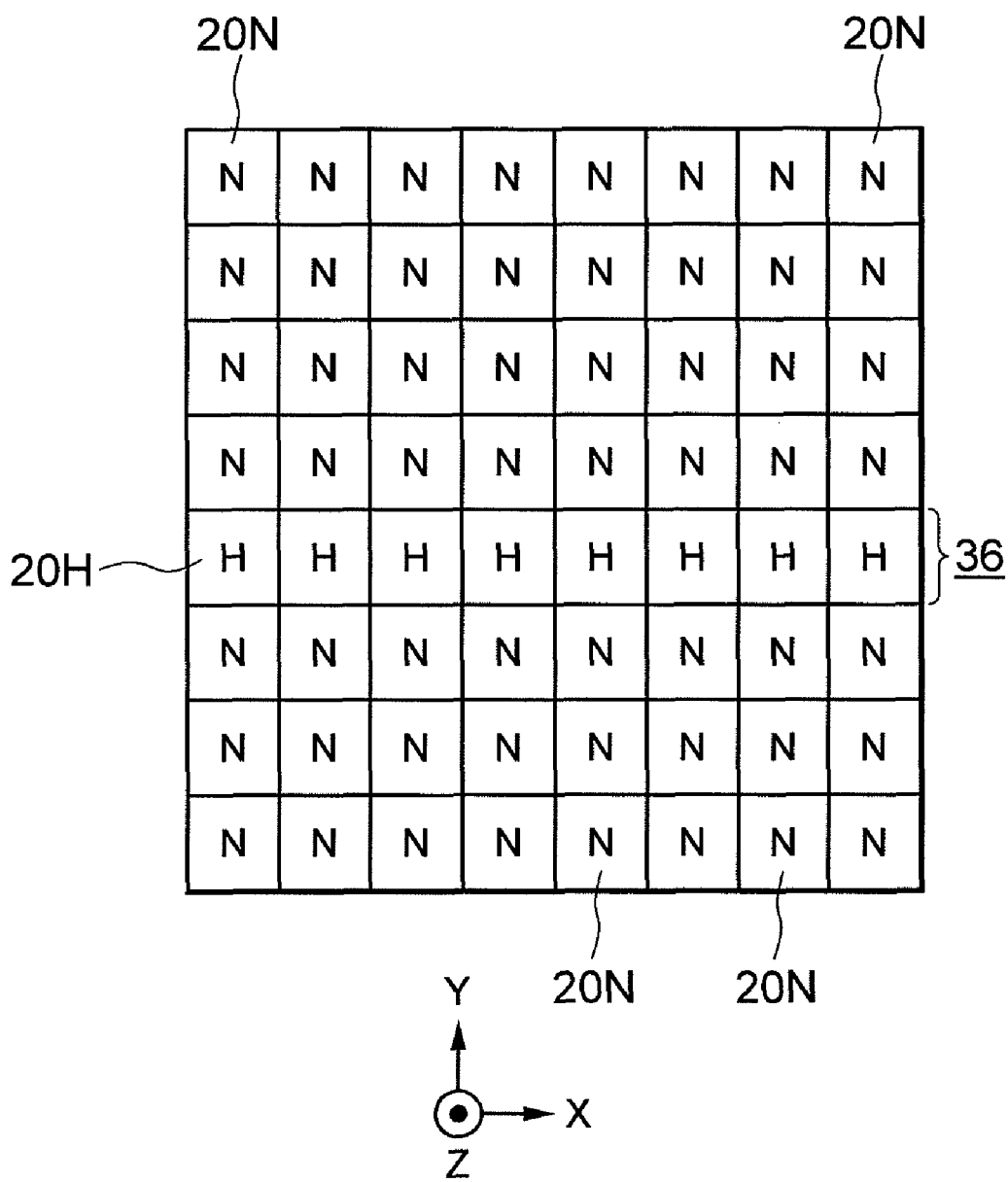
FIG. 5 is an enlarged view enlarging in the vicinity of the other focal point detection area shown in FIG. 3.

FIG. 4 is an enlarged view enlarging in the vicinity of a given focal point detection area 35 shown in FIG. 3, and schematically shows pixel configuration thereof. FIG. 5 is an enlarged view enlarging in the vicinity of the other focal point detection area 36 shown in FIG. 3, and schematically shows pixel configuration thereof. As described above, the solid-state imaging device 3 includes three kinds of pixels 20V, 20H, and 20N. In FIGS. 4 and 5, pixels 20V, 20H, and 20N are respectively denoted as "V", "H", and "N". When it is constructed for color image, colors of color filters of each pixel are set to realize, for example, a Bayer arrangement. However, the present invention may be constructed for monochrome.

As shown in FIG. 4, the focal point detection area 35 extending in Y-axis direction is a portion of a column of pixels 20V extending in Y direction. The focal point detection areas 33, 34 is the same as the focal point detection area 35. As shown in FIG. 5, the focal point detection area 36 extending in X-axis direction. The focal point detection areas 32 and 37 are the same as the focal point detection area 36.

Figure 6:
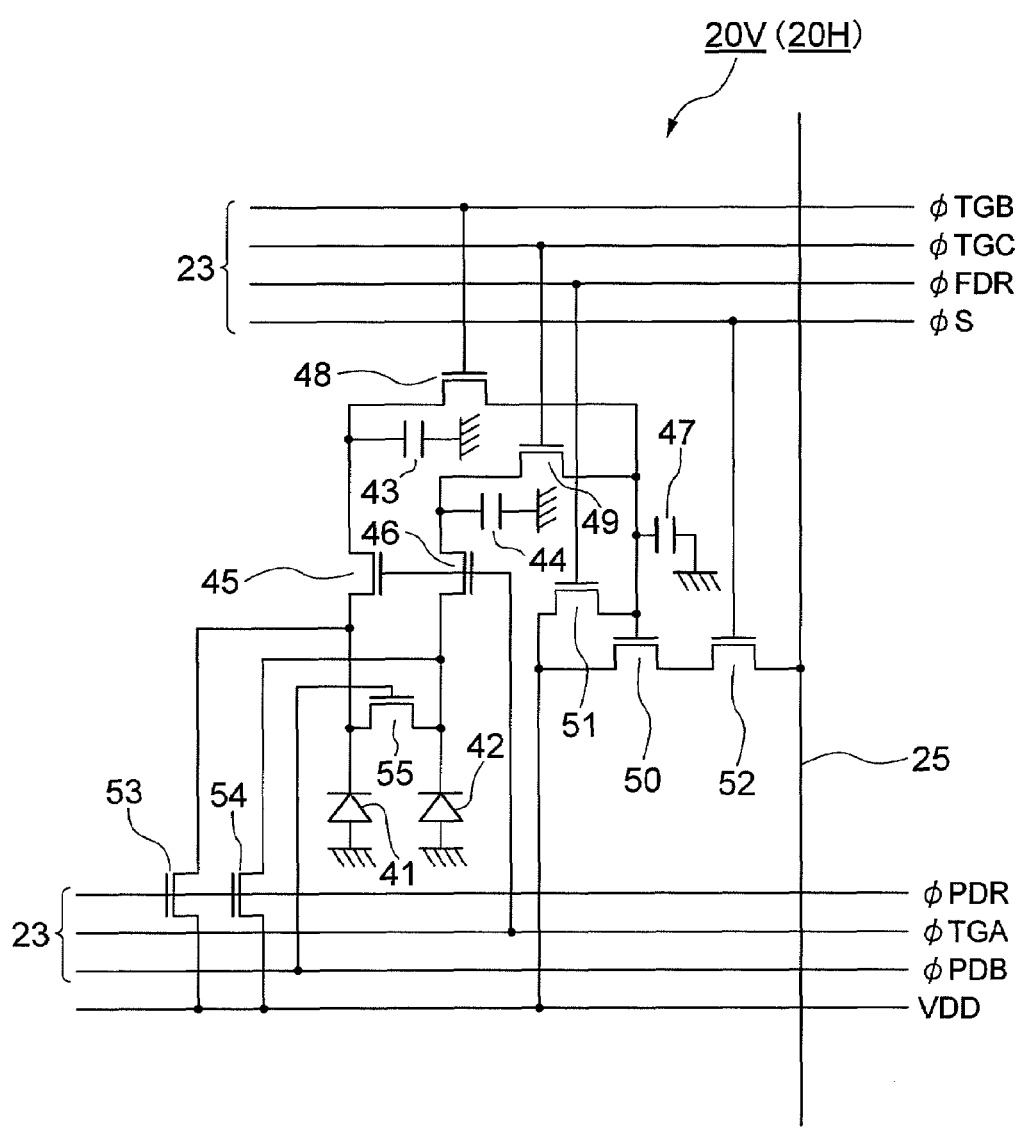
FIG. 6 is a circuit diagram showing a given pixel of the solid-state imaging device shown in FIG. 1.

FIG. 6 is a circuit diagram showing a given pixel 20V or 20H (see FIGS. 4 and 5) of the solid-state imaging device 3 shown in FIG. 1. These pixels 20V and 20H are the same circuit configuration.

Each of pixels 20V and 20H includes two pinned photodiodes 41, 42 as two photoelectric converter portions for generating and storing electric charge corresponding to incident light, a first and a second electric charge storage portions 43, 44 for separately storing electric charge transferred from the two pinned photodiodes 41, 42, a first and a second transfer transistors 45, 46 as a first and a second transfer portions for transferring electric charge from each pinned photodiode 41, 42 to the first and the second electric charge storage portions 43, 44 respectively, a floating diffusion (FD) 47 as a designated portion, a third and a fourth transfer transistors 48, 49 as a third and a fourth transfer gate portions for transferring electric charge from the first and the second electric charge storage portions 43, 44 to the FD47 respectively, an amplifying transistor 50 as an amplifying portion for outputting signal in accordance with the amount of electric charge of FD 47, an FD reset transistor 51 as a first reset portion for discharging electric charge of the FD47, a select transistor 52 as a select switch for outputting signal from the pixel 20V, 20H through the amplifying transistor 50, and a first and a second PD reset transistors 53, 54 as a second and a third reset portions (in other words, electric charge discharging portions) for discharging electric charge (disused electric charge generated by the pinned photodiodes 41 and 42) from the pinned photodiodes 41, 42. Moreover, each of the pixels 20V, 20H includes a connection/separation transistor 55 for electrically connecting and separating pinned photodiodes 41 and 42.

The first through fourth transfer transistors 45, 46, 48 and 49, the amplifying transistor 50, FD reset transistor 51, the select transistor 52, the first and the second PD reset transistors 53, 54, the connection/separation transistor 55 are constructed by MOS transistors. In the present embodiment, these transistors except amplifying transistor 50 become on when the gate electrode is high, and off when the gate electrode is low. This is illustrated in an N channel MOS transistor.

Gate electrode of the connection/separation transistor 55 is mutually connected within each pixel row, and drive signal (control signal) φPDB is provided from the vertical scanning circuit 21 through drive signal line 23. In the present embodiment, the connection/separation transistor 55 becomes on when φPDB is high, and pinned photodiodes 41 and 42 are electrically connected. As a result, the pinned photodiodes 41 and 42 becomes substantially equivalent to an undivided photoelectric converter. In the following explanation, this state is called as a "PD undivided state". On the other hand, when φPDB is low, the connection/separation transistor 55 becomes off, and pinned photodiodes 41 and 42 are electrically separated. As a result, the pinned photodiodes 41 and 42 are bisected. In the following explanation, this state is called as a "PD bisected state".

In the present embodiment, the first and the second electric charge storage portions 43, 44 are provided, and electric charge generated in the pinned photodiodes 41 and 42 is temporarily stored in the first and the second electric charge storage portions 43, 44 before transferring to FD47. Accordingly, it becomes possible to make exposure time and timing thereof regarding the all pixels the same, so that not only synchronism of the image signal can be secured, but also synchronism of the signal upon focal point detection can be secured. However, the present invention is not limited to this, and it may be constructed to carry out rolling shutter without providing electric charge storage portions 43, 44. In this case, synchronism in the horizontal direction (H pixel) can be secured, but not in the vertical direction (V pixel).

The first transfer transistor 45 transfers electric charge from the pinned photodiode 41 to the first electric charge storage portion 43. The second transfer transistor 46 transfers electric charge from the pinned photodiode 42 to the second electric charge storage portion 44.

Gate electrodes of the first and the second transfer transistors 45, 46 are mutually connected, and mutually connected to every pixel row, and drive signal φTGA is provided from the vertical scanning circuit 21 through drive signal line 23. The first and the second transfer transistors 45, 46 become on at the same time with a given timing in accordance with the drive signal φTGA, and electric charge is transferred from the two pinned photodiodes 41, 42 to the electric charge storage portions 43, 44 at the same time respectively. However, the present invention is not limited to this, for example, it may be possible to separately provide drive signal to each gate electrode so as to make the first and the second transfer transistor 45, 46 in the on state at the same time.

On the other hand, drive signals are separately provided to gate electrodes of the third and the fourth transfer transistors 48, 49. In other words, gate electrode of the third transfer transistor 48 is mutually connected every pixel row and drive signal φTGB is provided from the vertical scanning circuit 21 through drive signal line 23. Gate electrode of the fourth transfer transistor 49 is mutually connected every pixel row, and drive signal φTGC is provided from the vertical scanning circuit 21 through drive signal line 23. The third and the fourth transfer transistors 48, 49 become on state with a given timing in accordance with these drive signals φTGB and φTGC, and transfer electric charge from the first and the second electric charge storage portions 43, 44 to the FD47 with separate timings or at the same timing.

Gate electrode of the select transistor 52 is mutually connected every pixel row, and drive signal φS is provided from the vertical scanning circuit 21 through drive signal line 23. Gate electrode of the FD reset transistor 51 is mutually connected every pixel row, and drive signal φFDR is provided from the vertical scanning circuit 21 through drive signal line 23. Gate electrodes of the PD reset transistors 53, 54 are mutually connected every pixel row, and drive signal φPDR is provided from the vertical scanning circuit 21 through drive signal line 23.

However, by connecting gate electrodes of the PD reset transistors 53, 54 (in the case of pixel 20N, PD reset transistor 153 shown in FIG. 13 explained later) commonly in all effective pixels, PD reset transistors 53, 54 (in the case of pixel 20N, PD reset transistor 153 shown in FIG. 13 explained later) of all effective pixels may be on or off at the same.

In FIG. 6, one terminal of pinned photodiodes 41 through 42, one terminal of electric charge storage portions 43, 44, and one terminal of the FD47 are expediently shown to be grounded. However, as will be understood from FIGS. 8 through 10 explained later, they become electric potentials of P-type well 61.

Figure 7:
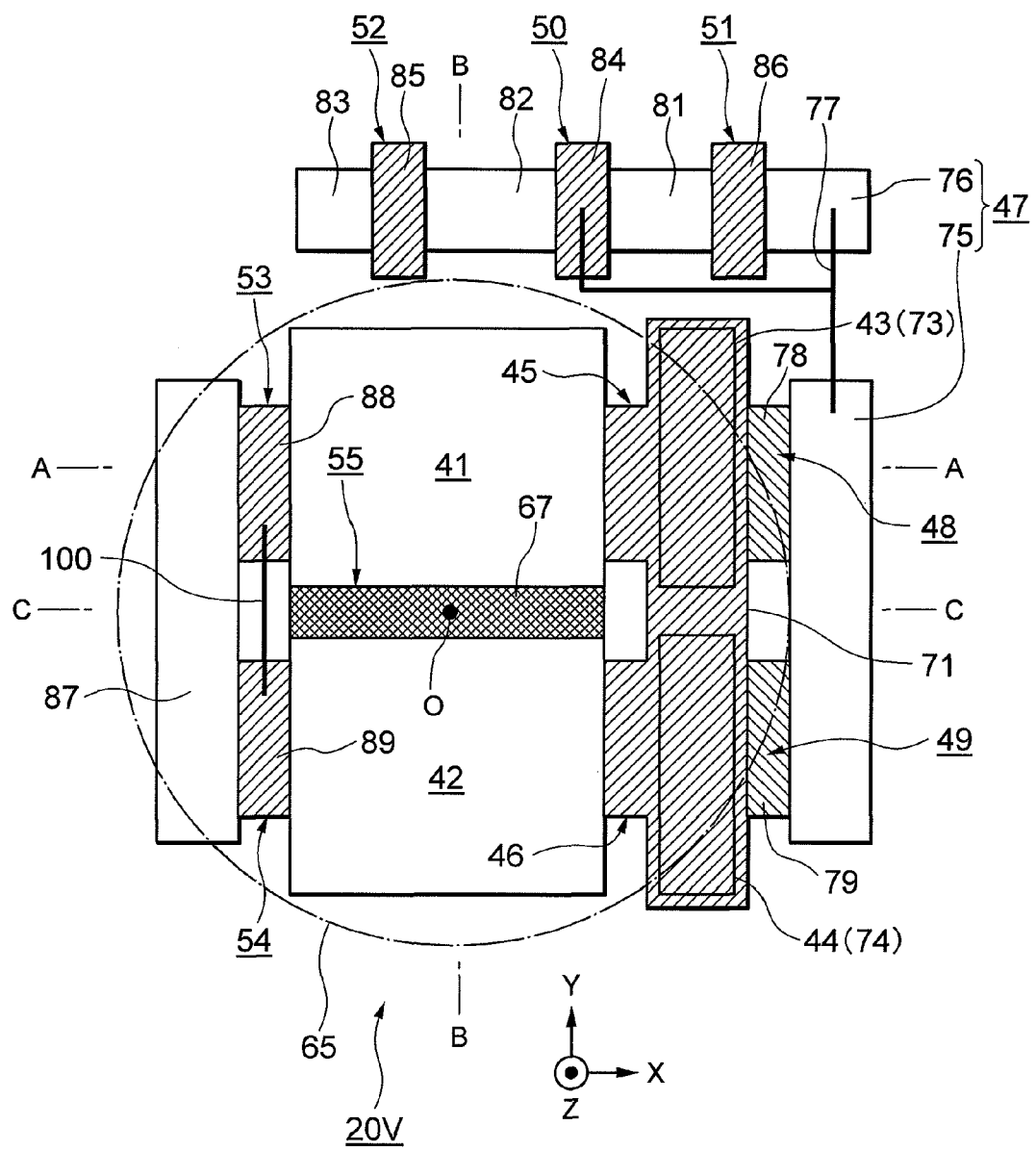
FIG. 7 is a plan view typically showing a given pixel of the solid-state imaging device shown in FIG. 1.
Figure 8:
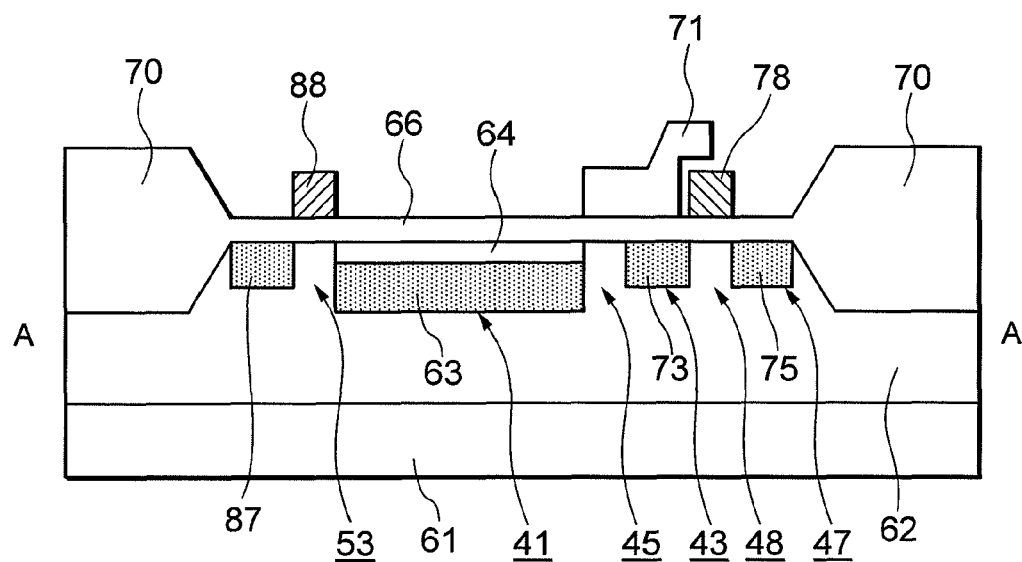
FIG. 8 is a sectional view along A-A line in FIG. 7.
Figure 9:
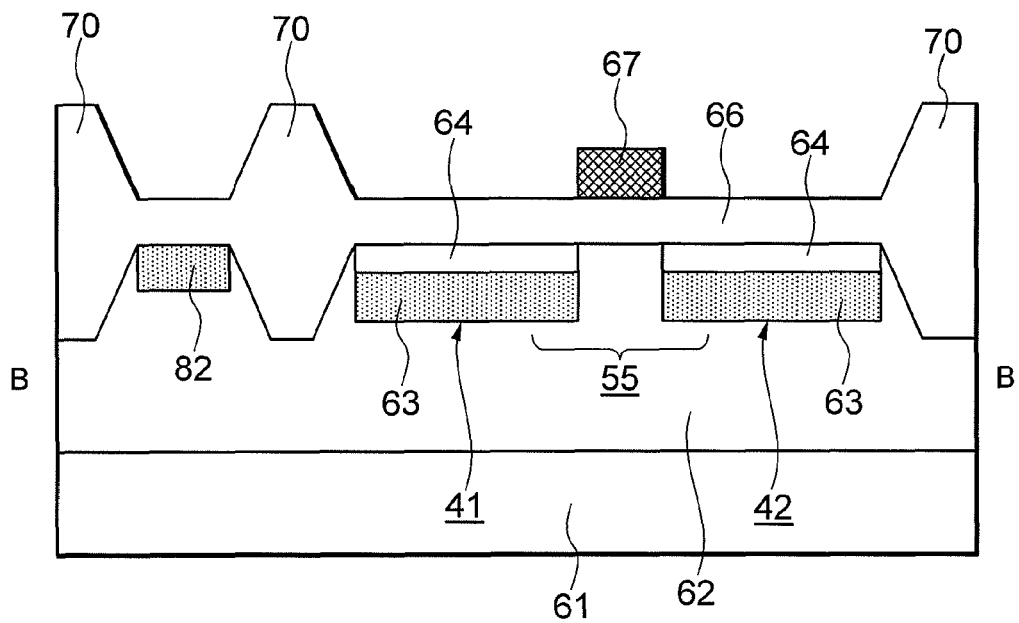
FIG. 9 is a sectional view along B-B line in FIG. 7 showing a given operating state.
Figure 10:
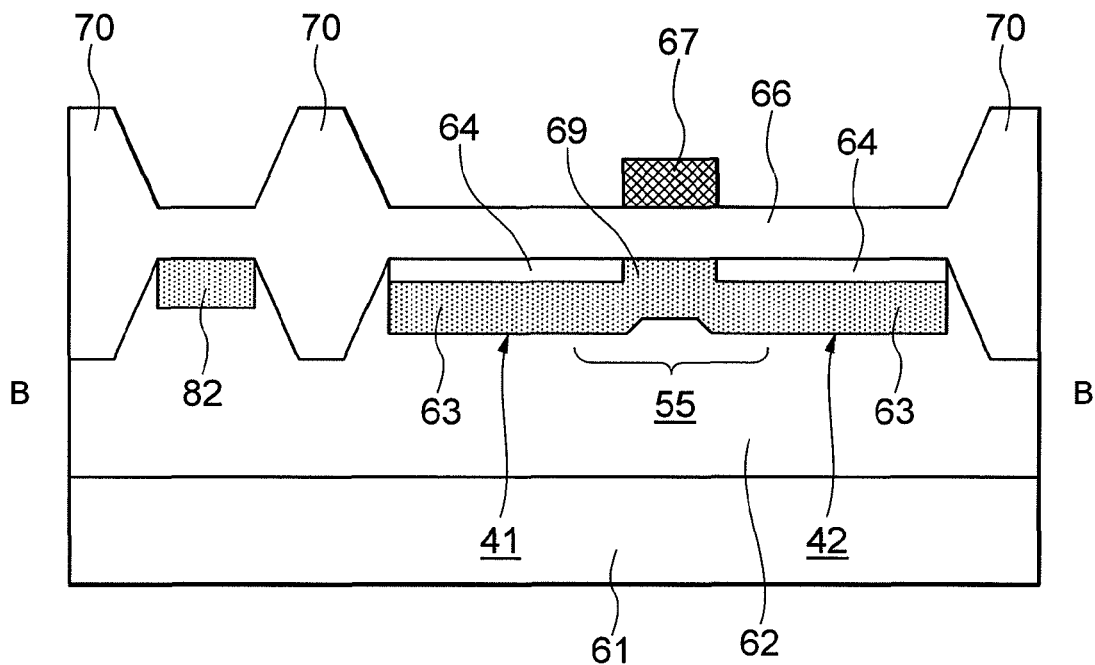
FIG. 10 is a sectional view along B-B line in FIG. 7 showing the other operating state.

FIG. 7 is a plan view typically showing a pixel 20V. FIG. 8 is a sectional view along A-A line in FIG. 7. FIGS. 9 and 10 are sectional views along B-B line in FIG. 7. FIG. 9 shows a state where the gate electrode 67 is low, in other words, φPDB is low, and the connection/separation transistor 55 is made to be off. FIG. 10 shows a state where the gate electrode 67 is high, in other words, φPDB is high, and the connection/separation transistor 55 is made to be on. In FIGS. 8 through 10, the micro-lens is omitted. In FIGS. 7 through 10, drive lines are omitted, except electrical connection of lines in the pixel 20V.

As shown in FIGS. 8 through 10, a P-type well 62 is formed on an N-type silicon substrate 61. An N-type charge storage layer 63 is formed on the P-type well 62, and by adding a P-type depletion prevention layer 64 on the substrate surface side of the charge storage layer 63 pinned photodiodes 41, 42 are composed. Here, although the construction of a pinned photodiode is adopted, the present invention is not limited to this, and the depletion prevention layer 64 may be omitted.

As shown in FIG. 7, the two pinned photodiodes 41, 42 are disposed in +Y side area and −Y side area divided by a division line C-C in X direction in a plane seen from Z direction. As shown in FIG. 7, a micro-lens 65 for leading incident light to the pinned photodiodes 41, 42 is disposed. The micro-lens 65 is disposed such that the optical axis thereof passes through the intersection of the division lines C-C and the center line of the pinned photodiodes 41, 42 in X direction. Accordingly, incident light led by the micro-lens 65 is divided at the pupil and led to each pinned photodiodes 41, 42. In order to lower the shading effect, for example, the micro-lens 65 may be disposed such that in a pixel located near the center of the effective pixel area the center of the micro-lens 65 comes to the intersection, on the other hand, in the periphery of the effective pixel area the center of the micro-lens 65 may come to a shifted position from the intersection.

As shown in FIGS. 7, 9 and 10, the gate electrode 67 is disposed along the division line C-C. The gate electrode 67 is formed on between the pinned photodiodes 41 and 42 through a thin silicon oxide layer 66. Accordingly, the gate electrode 67 forms a gate of an MOS transistor (connection/separation transistor 55) composed of the charge storage layer 63 of the pinned photodiode 31 and the charge storage layer 63 of the pinned photodiode 42 as a source or a drain. The drive signal φPDB is provided to the gate electrode 67 from a line (not shown).

In the present embodiment, when the gate electrode 67 is low (φPDB is low), since an inversion layer does not generated in the channel area of the connection/separation transistor 55 as shown in FIG. 9, the connection/separation transistor 55 becomes off. On the other hand, when the gate electrode 67 is high (φPDB is high), since an inversion layer 69 is generated in the channel area of the connection/separation transistor 55, the connection/separation transistor 55 becomes on.

Although the connection/separation transistor 55 becomes off when the voltage of the gate thereof is made to become zero potential (voltage of the substrate 61), it may be made to be on when the difference to the zero potential becomes large. Moreover, although the connection/separation transistor 55 becomes on when the voltage of the gate thereof is made to become zero potential (voltage of the substrate 61), it may be made to be off when negative voltage than the zero potential is applied.

In the present embodiment, the gate electrode 67 is made from a material transparent to at least one wavelength range in the visible light such as an ITO film. Accordingly, incident light is not blocked by the gate electrode 67, and reaches the area between the pinned photodiodes 41 and 42 located under the gate electrodes 67. Accordingly, for example, when the connection/separation transistor 55 is on as shown in FIG. 10, since an inversion layer 69 formed between the pinned photodiodes 41 and 42 has a photoelectric conversion function, using efficiency of the incident light can be enhanced. On the other hand, when the connection/separation transistor 55 is off as shown in FIG. 9, since an inversion layer 69 is not formed, the area between the pinned photodiodes 41 and 42 does not have a photoelectric conversion function.

The gate electrode 67 may be constructed by polysilicon instead of the ITO film. In the polysilicon case, although transmittance becomes partly lower than that of ITO film, since it can easily be formed as a fine structure, from collective consideration, there are instances where polysilicon can further reduce amount of light loss.

As is understood from the above explanation, in the present embodiment, the gate electrode 67 forms a mode setting means capable of selectively setting mode such as a PD undivided state that is a first mode, and a PD bisected state that is a second mode in accordance with the control signal (φPDB). In the PD bisected state, signals of pinned photodiodes 41, and 42 are independently obtained. In the PD undivided state, signals of pinned photodiodes 41 and 42 are added.

Moreover, between the first and the second electric charge storage portions 43, 44 and the pinned photodiodes 41, 42, the gate electrode 71 is formed through a thin silicon oxide film 66. The first and a second transfer transistors 45, 46 are constructed as MOS transistors whose gate is the gate electrode 71, and whose source and drain are electric charge storage portions 43, 44 and pinned photodiodes 41, 42, respectively.

A gate electrode of the first transfer transistor 45 and a gate electrode of the second transfer transistor 46 are integrally formed to become the electrode 71. Accordingly, the first and the second transfer transistors 45, 46 are on and off at the same time in accordance with drive signal φTGA. Therefore, respective electric charges from pinned photodiodes 41, 42 are transferred to corresponding electric charge storage portions 43, 44 at the same time.

The electric charge storage portions 43, 44 include N-type layers 73, 74 formed on the P-type well 62. The gate electrode 71 of the first and the second transfer transistor 45, 46 are disposed over upper parts of the two N-type layers 73, 74. In this manner, the electric charge storage portions 43, 44 are constructed as MOS capacitors by the gate electrode 71 and the N-type layers 73, 74.

When the gate electrode 71 is applied with low voltage, interface states of the surfaces of the electric charge storage portions 43, 44 come to the pinning potential of P-type well 62 and are filled with holes. Magnitude of a dark current is largely dependent on electron occupation probability of the interface state. Accordingly, dark currents of the electric charge storage portions 43, 44 can be drastically lowered by filling interface state with holes by applying voltage as described above to the gate electrode 71.

In FIG. 7, FD47 is constructed as substantially one floating diffusion by electrically connecting two N-type areas 75, 76 formed separately on the P-type well 32 with a wiring 77. Electric charge is transferred from either of the two electrical charge storage portions 43 and 44 to the FD47. The electric charge storage portions 43, 44 are disposed between the N-type area 75 of the FD47 and pinned photodiodes 41, 42. With this configuration, since the direction of transfer of the electric charge becomes one direction (here, X-axis direction), so that persistence hardly occurs.

Gate electrodes 78, 79 are formed through a thin silicon oxide film 66 between the first and the second electric charge storage portions 43, 44 and N-type diffusion layer 75 as the FD47. The third and the fourth transfer transistors 48, 49 are constructed as MOS transistors making the gate electrodes 78, 79 as gates, and N-type layers 73, 74 of the electric charge storage portions 43, 44 and N-type diffusion area 75 of the FD47 as sources or drains.

The gate electrode 78 of the third transfer transistor 48 and the gate electrode 79 of the fourth transfer transistor 49 are independently formed and supplied with independent drive signals φTGB and φTGC from the vertical scanning circuit 21. Accordingly, the third and the fourth transfer transistors 48, 49 are independently driven in accordance with respective drive signals φTGB and φTGC. Therefore, the third and the fourth transfer transistors 48, 49 can transfer electric charge from the first and the second electric charge storage portions 43, 44 either at the same time or different timings to the FD47.

Furthermore, as shown in FIG. 7, in the P-type well 62 N-type diffusion layers 81 through 83 are formed. The N-type layer 81 is connected to a power supply VDD by unillustrated wiring. A gate electrode 84 is formed on the N-type layers 81, 82 through a thin silicon oxide film 66. The amplifying transistor 50 is constructed as an MOS transistor making the gate electrode 84 as a gate, and the N-type layers 81, 82 as a source or a drain. The gate electrode 84 is connected to the FD47 (N-type layers 75, 76) by the wiring 77.

A gate electrode 85 is formed on a space between N-type layers 82 and 83 through a thin silicon oxide film 66. The select transistor 52 is constructed as an MOS transistor making the gate electrode 85 as a gate, and N-type layers 82, 83 as a source or a drain.

A gate electrode 86 is formed on a space between N-type layers 76 and 81 through a thin silicon oxide film 66. The FD reset transistor 51 is constructed as an MOS transistor making the gate electrode 86 as a gate, and N-type layers 76, 81 as a source or a drain.

As shown in FIGS. 7 and 8, N-type layer 87 is formed in P-type well 62. Gate electrodes 88, 89 are formed on a space between N-type layer 87 and the pinned photodiodes 41, 42 through a thin silicon oxide film 66. The first PD reset transistor 53 is constructed as an MOS transistor making the gate electrode 88 as a gate, and N-type layer 87 and the electric charge storage layer 63 of the pinned photodiode 41 as a source or a drain. The second PD reset transistor 54 is constructed as an MOS transistor making the gate electrode 89 as a gate, and N-type layer 87 and the electric charge storage layer 63 of the pinned photodiode 42 as a source or a drain. Gate electrodes 88, 89 are connected by a line 100, and drive signal φPDR is supplied to the gate electrodes 88, 89 by an unillustrated wiring. Here, although two gate electrodes 88, 89 are connected by the line 100, the electrodes 88, 89 may be formed integrally.

A second reset portions (here, PD reset transistors 53, 54) discharge unnecessary electric charge generated by the pinned photodiodes 41, 42. In the unnecessary electric charge, there are reset electric charge upon operating electric shutter and overflowed electric charge upon receiving strong incident light. In either case, unnecessary electric charge may be transferred to the FD47 and discharged by the first reset portion (here, FD reset transistor 51). When performing in this manner, the second reset portion is not necessary to be disposed.

Moreover, thick silicon oxide film 70 is formed on the circumference of the pinned photodiodes 41, 42, and each element is separated.

Figure 11:
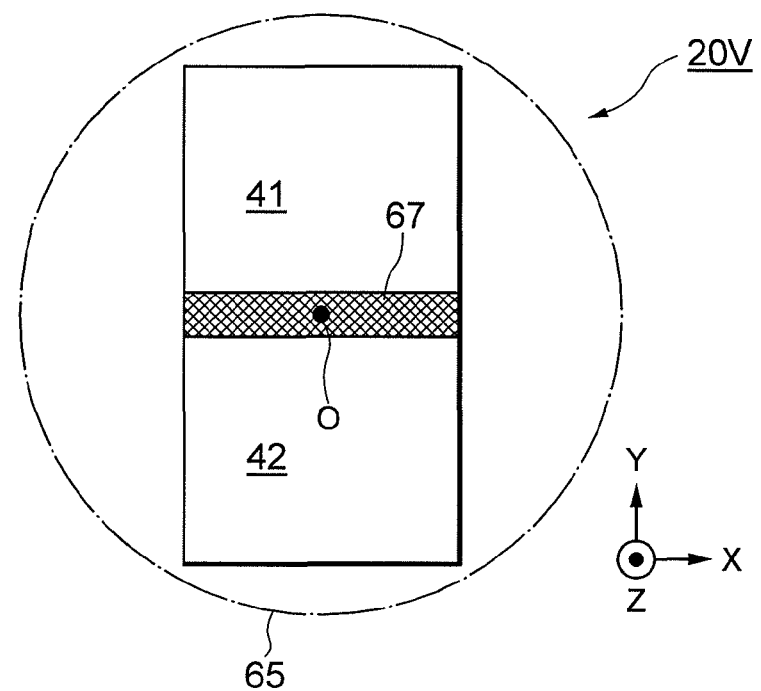
FIG. 11 is a plan view typically showing a main element of a given pixel of the solid-state imaging device shown in FIG. 1.

As described above, construction of pixel 20V (see FIG. 4) of the solid-state imaging device 3 shown in FIG. 1 is explained. In the pixel 20V, positional relation of the aforementioned micro-lens 65, pinned photodiodes 41, 42, and gate electrode 67 in the plane view is shown in FIG. 11 that is more abstracted than FIG. 7.

Figure 12:
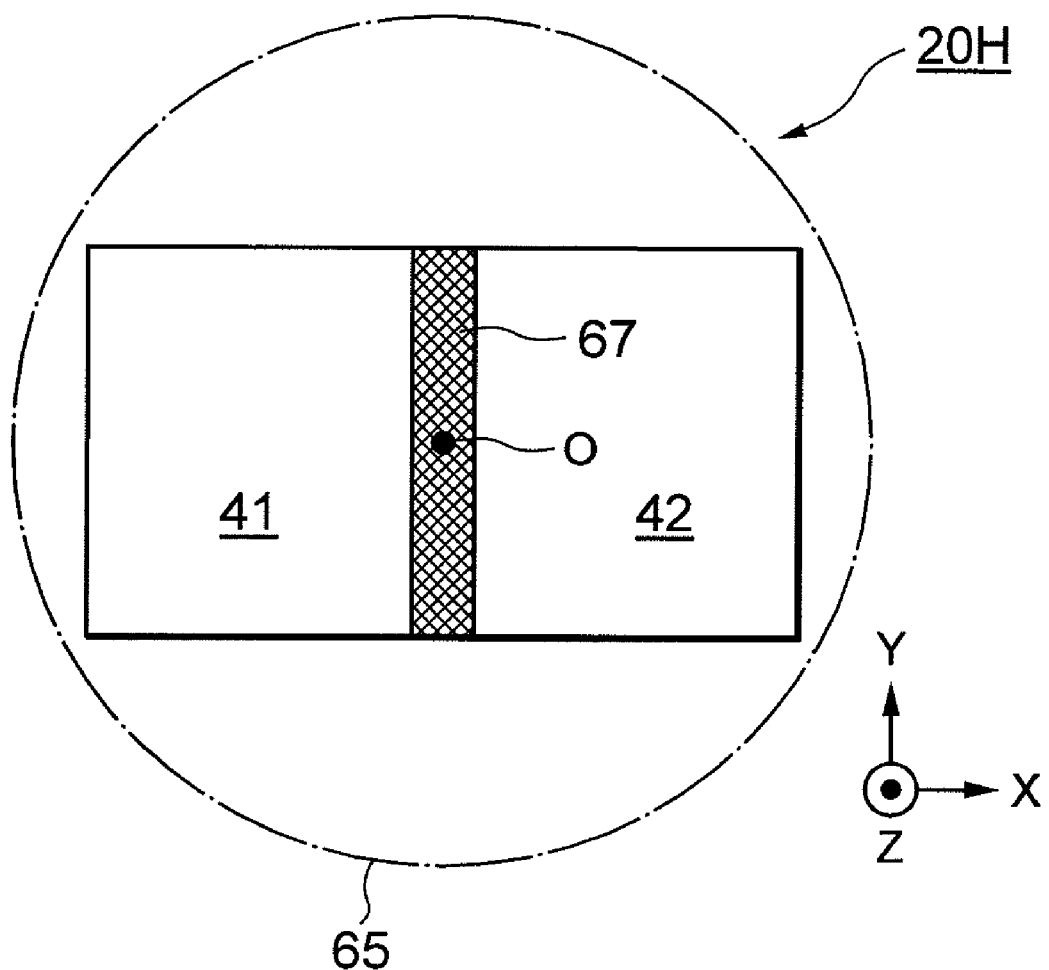
FIG. 12 is a plan view typically showing a main element of the other pixel of the solid-state imaging device shown in FIG. 1.

Then, the pixel 20H (see FIG. 5) of the solid-state imaging device 3 shown in FIG. 1 is explained. FIG. 12 is a plan view typically showing a positional relation of the micro-lens 65, pinned photodiodes 41, 42, and the gate electrode 67 of the pixel 20H, and corresponding to FIG. 11. In FIG. 12, the same or corresponding element in FIG. 11 is attached the same symbol, and duplicated explanations are omitted.

The points of the pixel 20H different from those of the pixel 20V are only the following that in the pixel 20V pinned photodiodes 41, 42 are disposed to +Y side and −Y side with respect to the gate electrode 67 disposed along the division line extended in X-axis direction, on the other hand, in the pixel 20H, pinned photodiodes 41, 42 are disposed to −X side and +X side with respect to the gate electrode 67 disposed along the division line extended in Y-axis direction, and, in accordance with this, arrangement of each transistor is changed that is not shown.

Accordingly, in the pixel 20V, the pinned photodiode 41 selectively, effectively receives light flux from the exit pupil area decentered to −Y side from the center of the exit pupil of the image-taking lens 2, and the pinned photodiode 42 selectively, effectively receives light flux from the exit pupil area decentered to +Y side from the center of the exit pupil of the image-taking lens 2. On the other hand, in the pixel 20H, the pinned photodiode 41 selectively, effectively receives light flux from the exit pupil area decentered to +X side from the center of the exit pupil of the image-taking lens 2, and the pinned photodiode 42 selectively, effectively receives light flux from the exit pupil area decentered to −X side from the center of the exit pupil of the image-taking lens 2.

Figure 13:
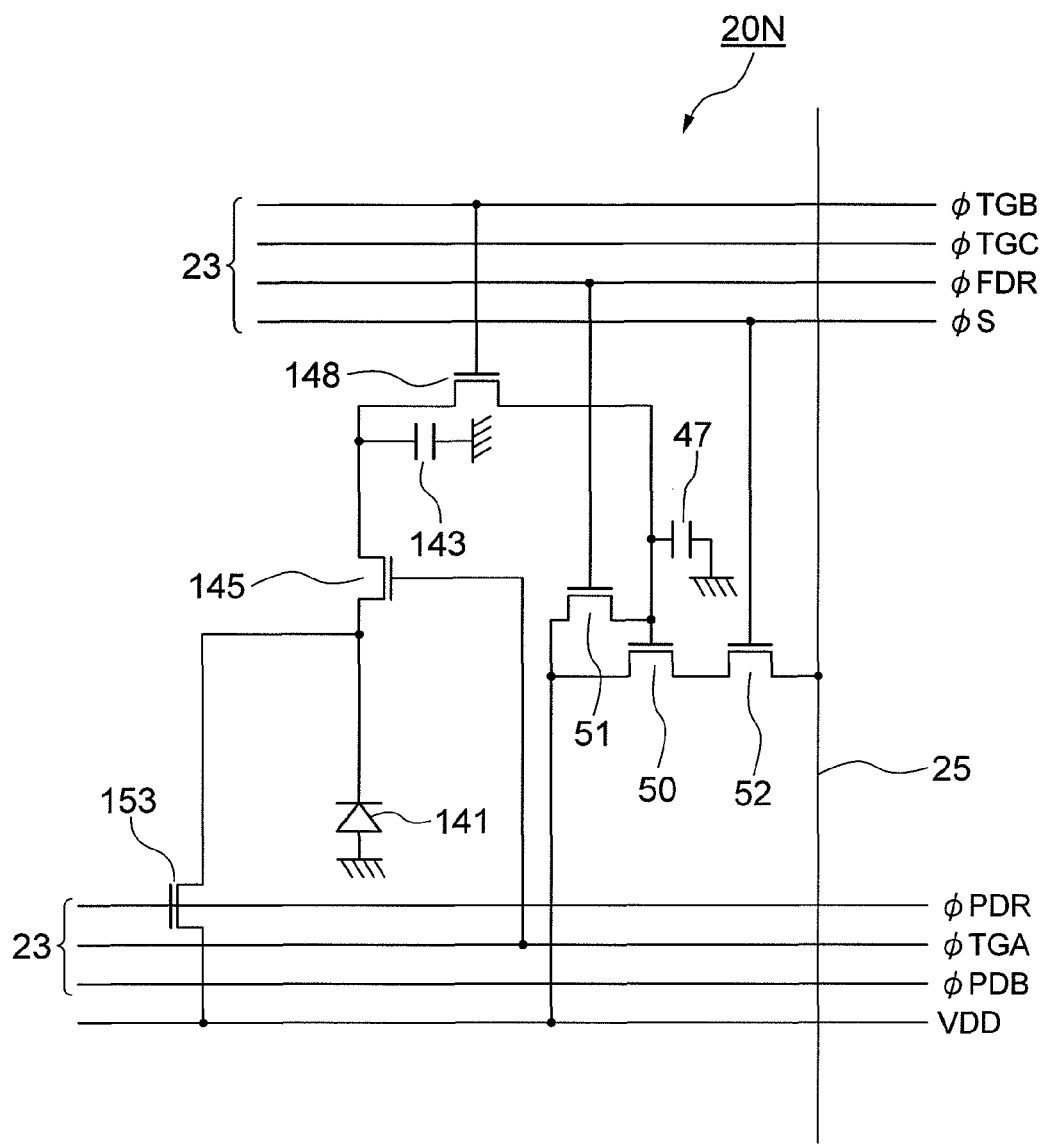
FIG. 13 is a circuit diagram showing the other pixel of the solid-state imaging device shown in FIG. 1.
Figure 14:
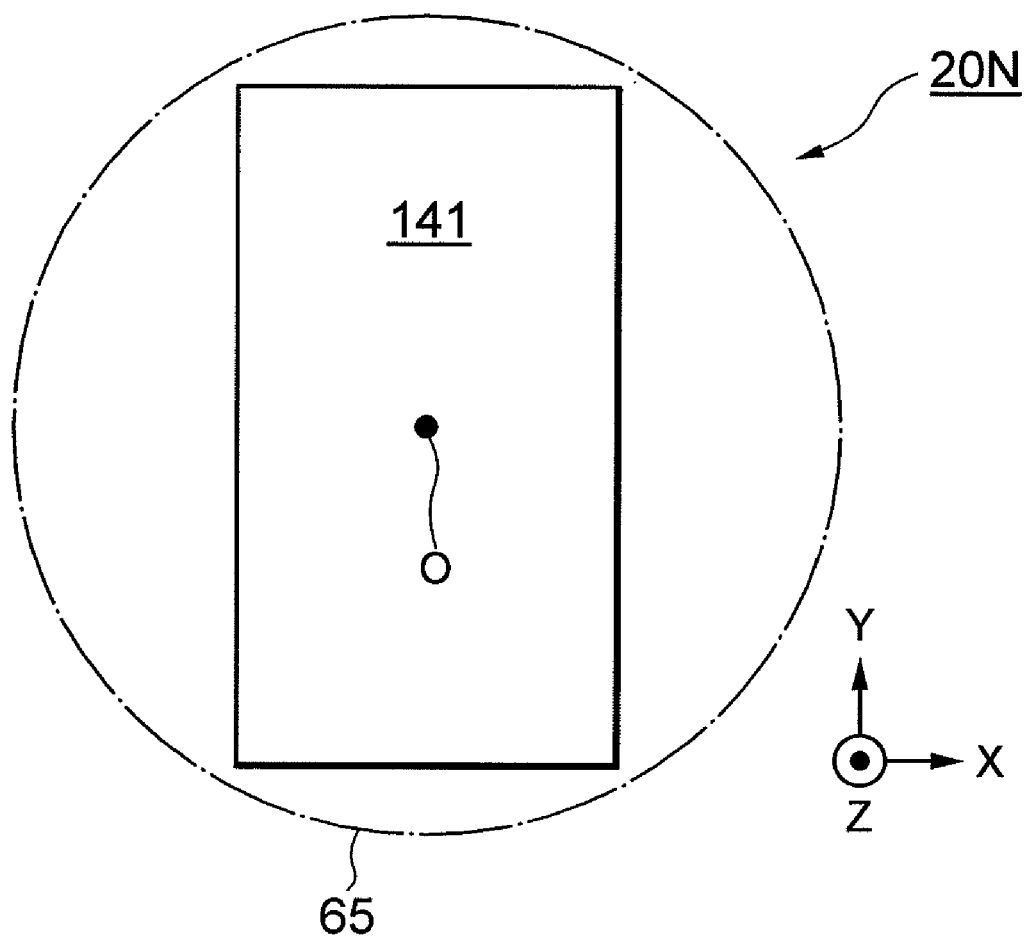
FIG. 14 is a plan view typically showing a main element of the other pixel of the solid-state imaging device shown in FIG. 1.

Then, the pixel 20N (see FIGS. 4 and 5) of the solid-state imaging device 3 shown in FIG. 1 is explained. FIG. 13 is a circuit diagram showing the pixel 20N. FIG. 14 is a plan view typically showing a positional relation of the micro-lens 65, pinned photodiode 141 of the pixel 20N, and corresponding to FIG. 11. In FIGS. 13 and 14, the same or corresponding element in FIG. 11 is attached the same symbol, and duplicated explanations are omitted.

The pixel 20N includes a pinned photodiode 141 that is constructed by integrally forming pinned photodiodes 41, 42 with removing gate electrode 67 shown in FIG. 6. In accordance with this, the pixel 20N includes an electric charge storing portion 143 corresponding to the first and the second electric charge storing portions 43, 44 shown in FIG. 6, a transfer transistor 145 corresponding to the first and the second transfer transistors 45, 46 shown in FIG. 6, and a transfer transistor 148 corresponding to the third and the fourth transfer transistors 48, 49 shown in FIG. 6. As understood from the above explanation, the pixel 20N has the same configuration as the pixel of the conventional solid-state imaging device.

Figure 15:
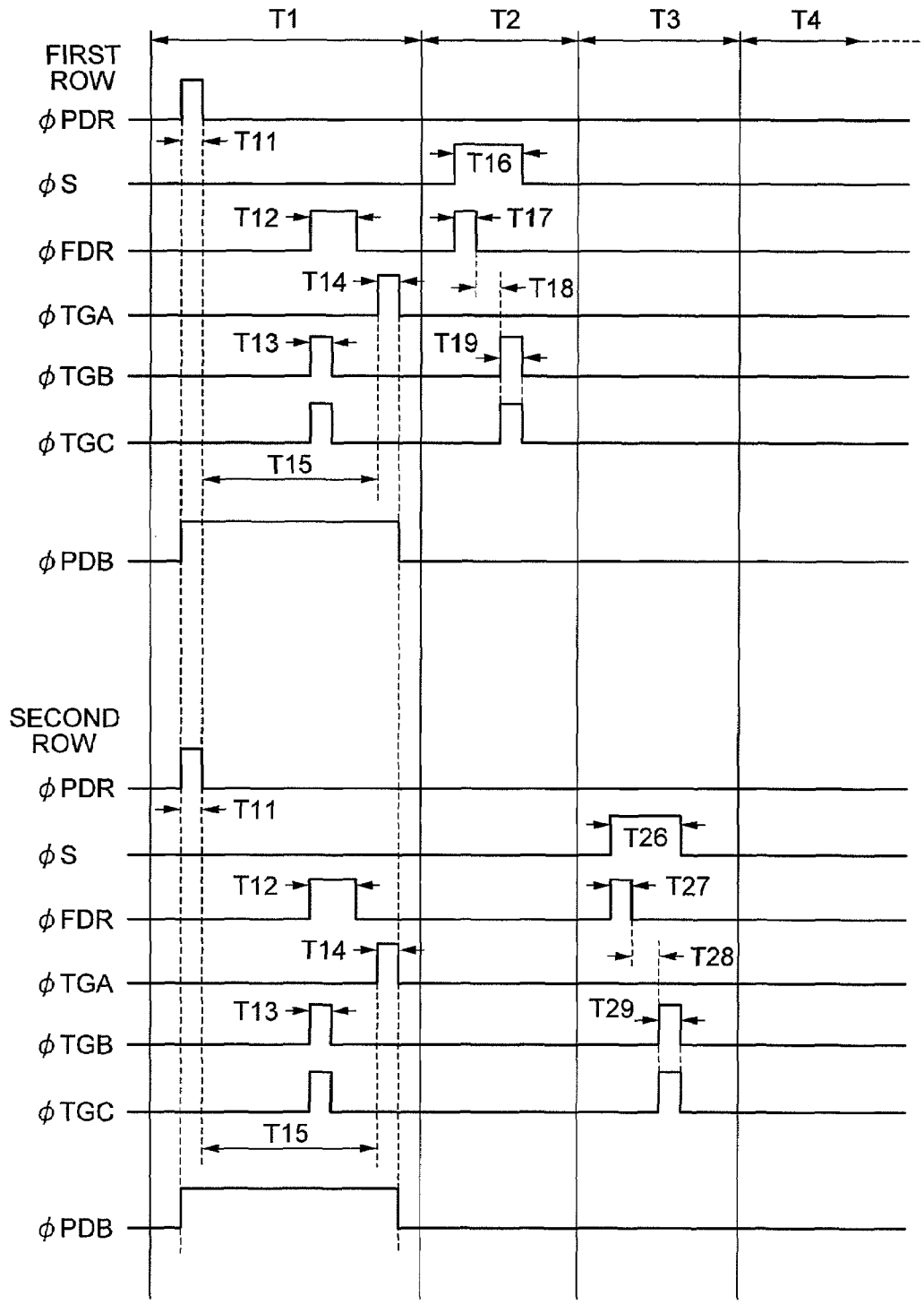
FIG. 15 is a timing chart showing an operating example of the solid-state imaging device shown in FIG. 1.
Figure 16:
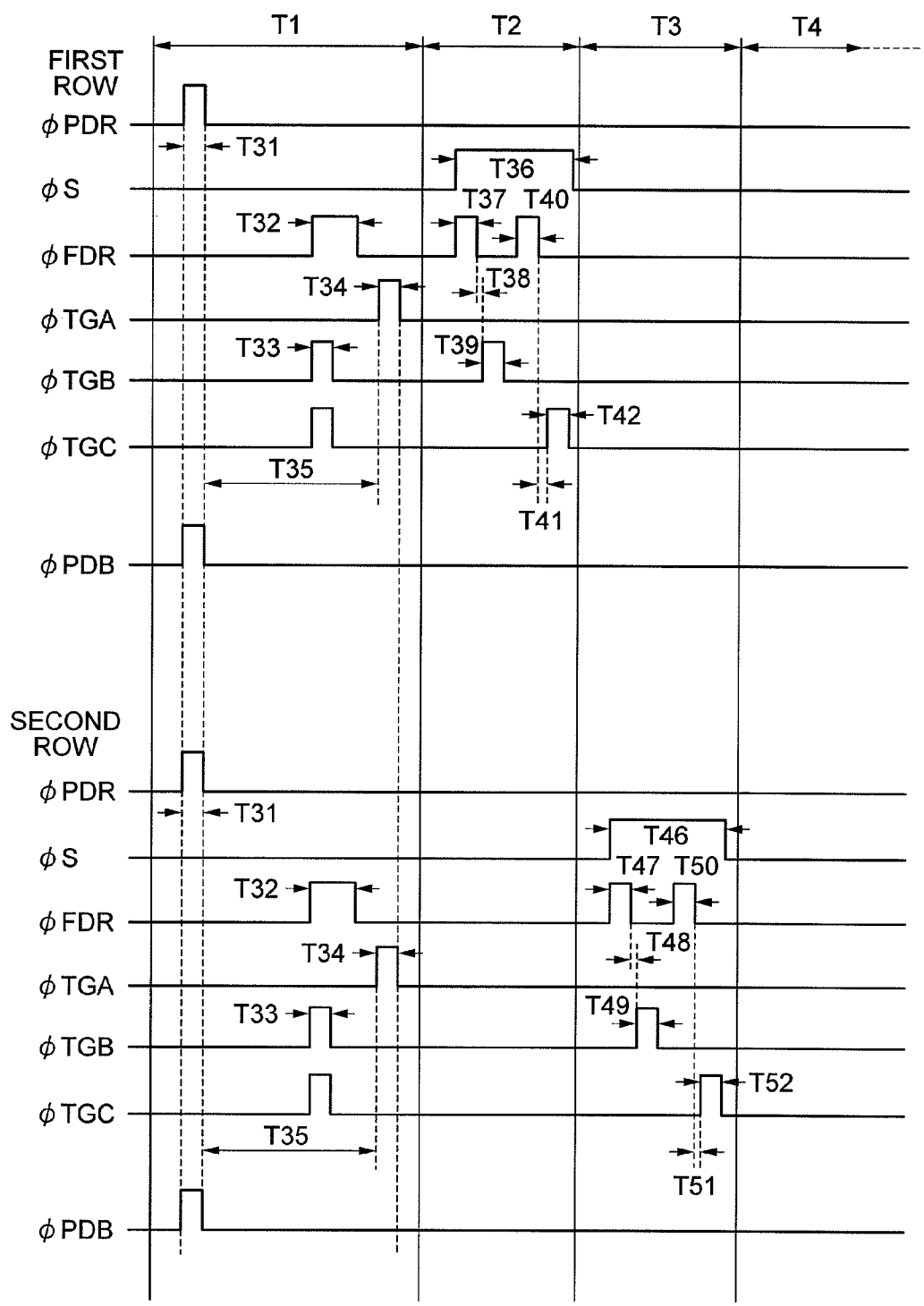
FIG. 16 is a timing chart showing the other operating example of the solid-state imaging device shown in FIG. 1.

Then, an example of timing for reading out signals from the solid-state imaging device 3 is explained with reference to FIGS. 15 and 16. FIG. 15 is a timing chart showing drive signals for reading out imaging signal, in other words, drive signals for reading out signals from pixels exposed in a PD undivided state. FIG. 16 is a timing chart showing drive signals for reading out focal point detection signal from pixels exposed in a PD bisected state.

As for vertical scanning, a signal line is selected every one horizontal row, and moved successively to the next row. In each selected row, movement shown in FIGS. 15 and 16 is carried out, and drive signals shown in figures are output. The scanning is repeated over entire image field in vertical direction. When the scanning has been completed at the bottom row, select movement is returned to the top row after a vertical returning period has elapsed. FIGS. 15 and 16 only shows drive signals in the first and the second rows.

At first, an example of movement for reading out imaging signal is explained with reference to FIGS. 15, 2, 6, and 13. In this movement, all pixels 20V and 20H among all effective pixels 20 except pixels 20N basically become a PD undivided state upon exposure. In this movement, all pixels are exposed at the same time.

In FIG. 15, a period T1 is a period when all effective pixels are driven at the same time. In other words, regarding drive pulse in the period T1, the same drive signals are output in all rows. The period T2 is a period for reading out the first row, the period T3 is a period for reading out the second row, the period T4 is a period for reading out the third row, and the drive signal shown in the figure is output only to the selected row. The same holds for FIG. 16 explained later.

At first, in the period from the starting point of period T11 to the ending point of period T14, all pixels 20V and 20H among all effective pixels 20 except pixels 20N become the PD undivided state by making φPDB high. Accordingly, the pinned photodiodes 41 and 42 of the pixels 20V and 20H as a whole become substantially equivalent to an undivided photoelectric converter. In this period, movements of the periods T11 through T14 explained later are carried out.

At first, in the period T11, φPDR is made high, so that the PD reset transistors 53, 54, 153 become on. With this movement, unnecessary electric charge stored in all effective pixels in the pinned photodiodes 41, 42, 141 is discharged to the electric power supply VDD. In other words, the pinned photodiodes 41, 42, 141 are reset. The pinned photodiodes 41, 42, 141 in all effective pixels start exposure at the time the period T11 is finished. On this occasion, in the present embodiment, photoelectric conversion of incident light is performed in the area between the pinned photodiodes 41 and 42 as described above. Accordingly, sensitivity upon exposure increases.

In the period T12, φFDR is made high, so that the FD reset transistor 51 becomes on. At the same time, in the period T13, φTGB and φTGC are made high, so that transfer transistors 48, 49, 148 become on at the same time. With this movement, electric charge stored in the FD47 and electric charge storage portions 43, 44, 143 are discharged to the electric power supply VDD. In other words, FD47 and the electric charge storage portions 43, 44, 143 in all effective pixels are reset.

In the period T14, φTGA is made high, so that the transfer transistors 45, 46, 145 become on. All electric charge stored in the connected pinned photodiodes 41, 42 and spaces between them in all pixels 20V and 20H among all effective pixels are transferred to the electric charge storage portions 43, 44 separately. All electric charge stored in the pinned photodiode 141 in all pixels 20N among all effective pixels are transferred to the electric charge storage portion 143. In the period T14, only one of the first and the second transfer transistors 45, 46 may be on. Here, the period T15 that is the period from the time φPDR being made low to the time φTGA being made on shown in FIG. 15 becomes exposure time. Exposure time T15 is the same period and the same timing for all effective pixels. Accordingly, all effective pixels can obtain imaging information without making mistakes in the timing.

Then, in the period T16, φS in the first row is made high, so that the select transistor 52 becomes on. Accordingly, pixels in the first row are selected, and signals from the pixels in the first row are output to the vertical signal line 25.

At the same time, in the period T17, φFDR in the first row is made high, so that the FD reset transistor 51 becomes on. With this movement, the FD47 is reset. At the end of the period T17, in other words, the period from the time φFDR is made low to the time the period T19 starts that is period T18, output of the amplifying transistor 50 of the first row upon resetting FD47 is stored in the CDS circuit 27 through the vertical signal line 25.

In the period T19, φTGB and φTGC are made high, so that the transfer transistors 48, 49, 148 are on at the same time. Accordingly, electric charge stored in the electric charge storage portions 43, 44 disposed two in each pixel 20V, 20H are combined and transferred together to the FD47. Electric charge stored in the electric charge storage portion 143 in each pixel 20N is transferred to the FD 47. Electric potential amplified in accordance with the electric charge stored in the FD40 is transferred to the CDS circuit 27 through the vertical signal line 25. In the CDS circuit 27, difference from the previously stored output upon reset is output as the image signal of the first row. Then, the image signal of the first row is output by the drive signal of the horizontal scanning circuit 22 through the horizontal signal line 28 and the output amplifier 29.

Likewise, in the period T3, the second row is red out. The drive signal is the same as the first row. The periods T26 through T29 in FIG. 9 are corresponding to the periods T16 through T19.

Incidentally, φPDR may be always high after completion of reading out, in other words, after φS is off.

As understood from the explanation above, in each pixel 20V, 20H, since φPDB is made high, and two pinned photodiodes 41 and 42 are combined in the period from the start of the period T11 to the end of the period T14, image signal can be output as usual as in the case of the pixel 20V, 20H. Moreover, since gate electrode 67 disposed along the division line transmits incident light, using efficiency of the incident light enhances and sensitivity can be improved. Moreover, it is obvious from the explanation above that an electronic shutter capable of making exposure timing of all pixels the same is possible. There is no doubt that the movement of a rolling shutter for resetting every row is also possible regardless of existence of electric charge storing portions 43, 44.

An example of movement for reading out focal point detection signal exposed in a PD bisected state is explained with reference to FIGS. 16, 2, and 6. In this movement, all pixels 20V, 20H basically become in a PD bisected state upon exposure. In this movement, all pixels are exposed at the same time. Upon reading out focal point detection signal, signal obtained from the pixel 20N is not used for focal point detection signal, so that in the following explanation only pixels 20V and 20H are explained.

The signal of all pixels red out in this movement is temporally stored in the memory 7 shown in FIG. 1, and then upon carrying out focal point detection processing at the focal point calculator 10, signals regarding only desired row of pixels are selectively used from the memory 7. In the example of movement shown in FIG. 16, although focal point detection signal is obtained by reading out all pixels, pixels other than desired row of pixels may be thinned out and not necessary to be red out.

At first, in the period T31, φPDR is made to be high, so that PD reset transistor 51 becomes on, and φPDB is made to be high, so that it becomes PD undivided state. With this movement, unnecessary electric charge stored in pinned photodiodes 41 and 42 of all effective pixels 20V, 20H is discharged to the power supply VDD. In other words, the pinned photodiodes 41 and 42 are reset. The pinned photodiodes 41 and 42 of all effective pixels starts exposure at the end of the period T31.

φPDB is made to be low in the period T1. Accordingly, even in the period T35, all pixels 20V, 20H become the PD bisected state, and the pinned photodiodes 41 and 42 of each pixel as a whole become substantially equivalent to a bisected photoelectric converter portion. In this period, movements according to the period T32 through T34 explained below are carried out.

In the period T32, φFDR is made to be high, so that the FD reset transistor 51 becomes on. At the same time, in the period T33, φTGB and φTGC are made to be high, so that the third and the fourth transfer transistor 48, 49 become on at the same time. With this movement, electric charge stored in the FD47, the first and the second electric charge storage portions 43, 44 are discharged to the power supply VDD. In other words, the FD47 and electric charge storage portions 43, 44 of all pixels 20V, 20H are reset.

In the period T34, φTGA is made to be high, so that the first and the second transfer transistors 45, 46 become on. As a result, electric charge stored in the pinned photodiodes 41 and 42 of all pixels 20V, 20H are transferred to the first and the second electric charge storage portions 43, 44 through the first and the second transfer transistors 45, 46, respectively. Here, the period T35, in other words, the period from making φPDB low to making φTGA on shown in FIG. 16 is the exposure period. The exposure period T35 is the same period and the same timing for all pixels 20V, 20H. Accordingly, all pixels 20V, 20H can obtain focal point detection information without shifting timing. The movements of the period so far (period T1) is the same as the movements for obtaining image signal explained with reference to FIG. 15 except exposure is carried out in the PD bisected state.

Then, in the period T36, φS of the first row is made to be high, so that the select transistor 52 becomes on. Accordingly, pixels of the first row are selected, and signals are output from pixels of the first row to the vertical signal line 25.

At the same time, in the period T37, φFDR of the first row is made to be high, and the FD reset transistor 51 is on. With this movement, FD47 is reset. At the end of the period T37, in other words, during the period (period T38) after φFDR becomes low to the start of the period T39, the output from the amplifying transistor 50 of the first row upon resetting the FD47 is stored in the CDS circuit 27 through the vertical signal line 25.

In the period T39, φTGB is made to be high, so that the third transfer transistor 48 becomes on. Accordingly, electric charge stored in the first electric charge storage portion 43 is transferred to the FD47. Potential amplified in accordance with the amount of electric charge of the FD47 is transferred to the CDS circuit 27 through the vertical signal line 25. In the CDS circuit 27, the difference from the previously stored output upon resetting FD47 is output as a pupil signal output of one of the upper-and-lower or left-and-right direction of the pixels in the first row. These pupil signal output of one of the upper-and-lower or left-and-right direction of the pixels in the first row is output by the drive signal of the horizontal scanning circuit 22 through the horizontal signal line 28 and the output amplifier 29.

Then, in the period T40, φFDR of the first row is made to be high, and the FD reset transistor 51 is on. With this movement, FD47 is reset. At the end of the period T40, in other words, during the period, that is the period T41, after φFDR becomes low to the start of the period T42, the output from the amplifying transistor 50 of the first row upon resetting the FD47 is stored in the CDS circuit 27 through the vertical signal line 25.

In the period T42, φTGC is made to be high, so that the fourth transfer transistor 49 becomes on. Accordingly, electric charge stored in the second electric charge storage portion 44 is transferred to the FD47. Potential amplified in accordance with the amount of electric charge of the FD47 is transferred to the CDS circuit 27 through the vertical signal line 25. In the CDS circuit 27, the difference from the previously stored output upon resetting is output as a pupil signal output of the other of the upper-and-lower or left-and-right direction of the pixels in the first row. These pupil signal output of the other of the upper-and-lower or left-and-right direction of the pixels in the first row is output by the drive signal of the horizontal scanning circuit 22 through the horizontal signal line 28 and the output amplifier 29.

With this movement, pupil signal output of one of the upper-and-lower or left-and-right direction and pupil signal output of the other of the upper-and-lower or left-and-right direction of the pixels in the first row can be obtained. The direction of the upper-and-lower or the left-and-light is determined whether the pixel is 20V or 20H.

Similarly the following rows are red out. Drive signal is the same as the first row. The periods T46 through T52 in FIG. 16 correspond to the periods T36 through T42.

After completion of readout, in other words, after φS is off, φPDR may be always high.

As is understood from the above explanation, since each pixel becomes in the PD bisected state by making φPDB low in the period T1, pupil signal output of one of the upper-and-lower or left-and-right direction and pupil signal output of the other of the upper-and-lower or left-and-right direction of each pixel can be obtained. Furthermore, it is obvious from the above explanation that upon obtaining focal point detection signal, an electronic shutter whose exposure timing is the same over entire effective pixels can be available. There is no doubt that the movement of a rolling shutter for resetting every row is also possible regardless of existence of electric charge storing portions 43, 44.

Then, an example of movement of an electronic camera 1 according to the present embodiment is explained with reference to FIG. 1.

When a release button in the operating portion 9a is half-pressed, the microprocessor 9 in the electronic camera 1 drives the imaging controller 4 corresponding to the half-press operation. The imaging controller 4 sends control signal to an imaging device 3 to make the imaging device 3 carry out the movement explained with reference to FIG. 16 to obtain signals from all pixels 20V, 20H, 20N to store these signals into the memory 7 through the signal processor 5 and the A/D converter 6.

Then, when the currently set focal point adjusting mode is, for example, a mode that carries out focal point adjustment based only on the focal point detection area 35 shown in FIGS. 3 and 4 (hereinafter called as a "focal point detection area 35 mode"), the microprocessor 9 picks up signals from the photodiodes 41, 42 of all pixels 20V, 20H within the focal point detection area 35 among the focal point detection signals stored in the memory 7 in advance, makes the focal point calculator 10 calculate a defocus amount by carrying out calculation in accordance with the pupil division phase difference detection method, in other words, detecting a focal point adjusting state.

Moreover, when the currently set focal point adjusting mode is, for example, a mode that carries out focal point adjustment based on all focal point detection areas 32 through 37 shown in FIG. 3 (herein after called as an "all focal point detection areas mode"), defocus amount is calculated with each of focal point detection areas 32 through 34, 36, 37 as well as the focal point detection area 35

Then, when the currently set focal point adjusting mode is the focal point detection area 35 mode, the microprocessor 9 makes the lens controller 2a controls the image-taking lens 2 to become an in-focus state on the basis of the previously obtained defocus amount regarding the focal point detection area 35. On the other hand, when the currently set focal point adjusting mode is the all focal point detection areas mode, the microprocessor 9 makes the lens controller 2a control the image-taking lens 2 to become an in-focus state on the basis of the previously obtained each defocus amount regarding each focal point detection area. Then, the microprocessor 9 sets shooting conditions for actual shooing such as an f-number, an exposure time, and the like.

Then, the microprocessor 9 makes the lens controller 2a control the image-taking lens 2 to become the in-focus state on the basis of the previously obtained defocus amount. Then, the microprocessor 9 sets shooting conditions for actual shooing such as an f-number, an exposure time, and the like.

Then, the microprocessor 9 operates the lens controller 2a to become set conditions such as the f-number, reads out image signals by driving the imaging controller 4 with conditions such as the exposure time the set in step S9 synchronizing with an operation of full-press of the release button of the operation portion 9a, and carries out an actual shooting. At this time, the microprocessor 9 reads out image signal by the previously described movements shown in FIG. 15. The image signal is stored in the memory 7 by the imaging controller 4.

Then, if necessary, the microprocessor 9 carries out desired processing at the image processor 13 or the image compressor 12 on the basis of an instruction by the operation portion 9a, and makes the recorder output processed signal to record on the recording medium 11a.

According to the present embodiment, it becomes possible to set a PD bisected state, in other words, a state that the pinned photodiodes 41, 42 are electrically separated, or a PD undivided state, in other words, a state that the pinned photodiodes 41, 42 are electrically connected, in accordance with a control signal provided to the gate electrode 67 in the pixel 20V, 20H.

Accordingly, by making PD bisected state upon focal point detection, the focal adjusting state of the image-taking lens can be detected by obtaining focal point detection signal from the pixels 20V, 20H, and by making PD undivided state, it becomes possible to increase optical performance without causing the same state as a defective pixel.

As described above, in the present embodiment, there is an area having light sensitivity to the incident light under the gate electrode 67 upon the PD undivided state. Accordingly, in the present embodiment, it becomes possible to increase sensitivity upon shooting in comparison with the case that the floating diffusion is disposed between one portion and the other portion of the bisected photoelectric conversion portions such as the solid-state imaging device disclosed in Japanese Patent Application Laid-Open No. 2003-244712.

[Second Embodiment]

Figure 17:
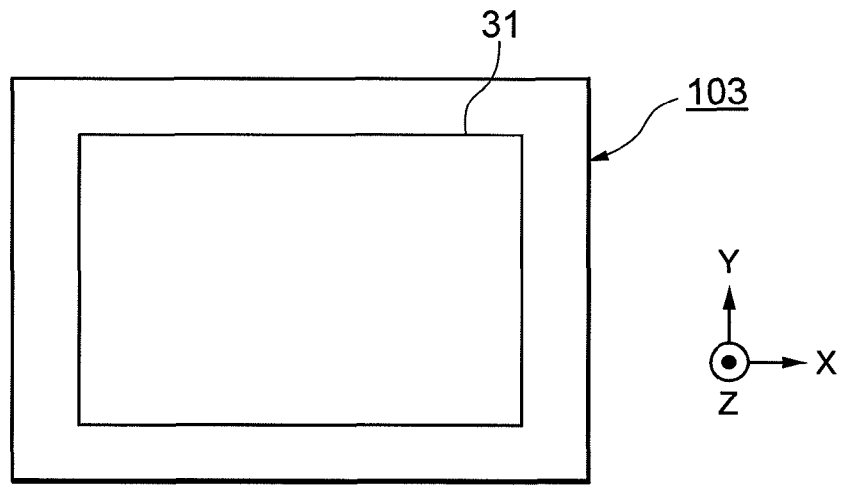
FIG. 17 is a plan view showing a solid-state imaging device of an electronic camera according to a second embodiment of the present invention.

FIG. 17 is a plan view showing an imaging area 31, in particular, of a solid-state imaging device 103 of an electronic camera according to a second embodiment of the present invention corresponding to FIG. 3.

Figure 18:
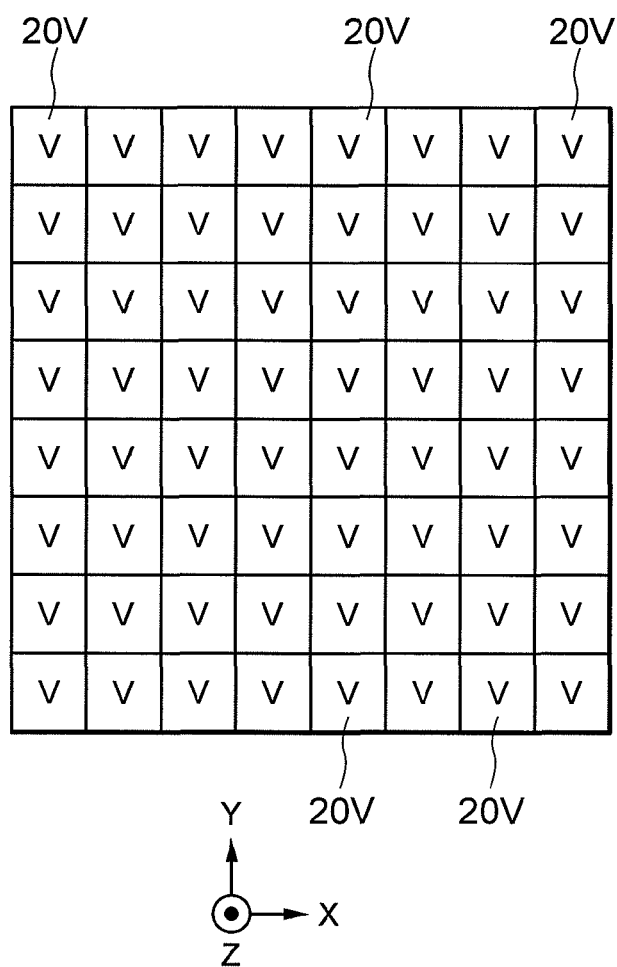
FIG. 18 is an enlarged view enlarged any area of an imaging area shown in FIG. 17.
Figure 19:
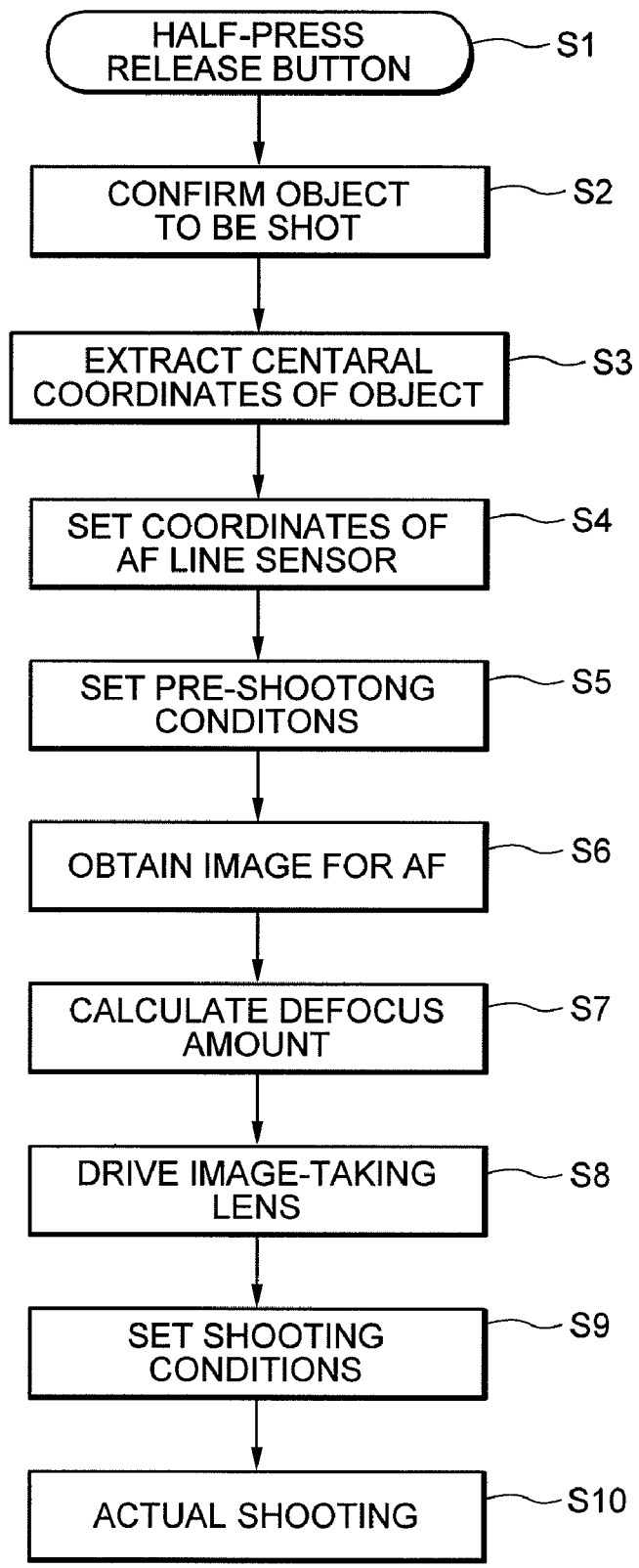
FIG. 19 is a flow chart schematically showing movement of the electronic camera according to the second embodiment of the present invention.

FIG. 18 is an enlarged view enlarged any area of an imaging area 31 shown in FIG. 17 corresponding to FIG. 4. FIG. 19 is a flow chart schematically showing movement of the electronic camera according to the second embodiment of the present invention. In FIG. 17 or 18, the same or similar component as in FIG. 3 or 4 is attached the same symbol to eliminate duplicated explanations.

The point where the present embodiment is different from the first embodiment is that any specific area such as the focal point detection areas 32 through 37 are not disposed in the imaging area 31, all pixels 20 of effective area are the pixel 20V shown in FIGS. 6 through 11, and the electronic camera 1 according to the present embodiment carries out the movement shown in FIG. 19.

The movement of the electronic camera according to the present embodiment is explained with reference to FIGS. 19 and 1.

When a release button in the operating portion 9a is half-pressed (step S1), the microprocessor 9 in the electronic camera 1 drives the imaging controller 4 corresponding to the half-press operation. In order to confirm an object, the imaging controller 4 reads out imaging signal for confirming object from all pixels or given pixels by a given well-known method, and stores in the memory 7. In this case, when all pixels are to be red out, for example, the same movements shown in FIG. 15 are carried out. The image processor 13 confirms object by using image confirming technique from the signal (step S2). For example, in a face-confirming mode, a face as an object is confirmed. The image processor 13 picks up central coordinates and a longitudinal direction of the object (step S3).

Then, the microprocessor 9 sets coordinates of pixel line, in other words, positional coordinates of the column in Y axis direction corresponding to a line sensor for auto focus optimum for precision detection of focal point adjusting state to the object on the basis of the center coordinates and longitudinal direction picked up in step S3 (step S4). Microprocessor 9 sets shooting conditions such as an f-number, a focal point adjusting state, an exposure time, and the like for focal point detection on the basis of confirmation results in step S2 (step S5).

The microprocessor 9 successively moves the lens controller 2a to become the conditions such as the f-number set by the step S5, and drives the imaging controller 4 to become exposure time condition set by the step S5 and pixel line coordinates set by the step S4, and reads out auto focus signal to store the memory 7 (Step S6). At this time, image signal for auto focus is red out by the similar movements shown in FIG. 16.

Then, the microprocessor 9 picks up signals of each pixel in the pixel line of coordinates set in the step S4, in other words, signals of each pixels of the pixel column in Y axis direction among signals of all pixels stored in the memory 7 obtained in the step S6, makes the focal point calculator 10 calculate in accordance with the pupil division phase difference detection method on the basis of these signals to obtain an amount of defocus (Step S7).

Then, the microprocessor 9 makes the lens controller 2a adjust the image-taking lens 2 to come to focal point adjusting state in accordance with the amount of defocus calculated in step S7. The microprocessor 9 successively set shooting condition such as the f-number, the exposure time, and the like for shooting.

Then, the microprocessor 9 makes the lens controller 2a set the f-number and the like to become the condition set in the step S9, and in synchronization with a full-press of the release button in the operating portion 9a drives the imaging controller 4 with the exposure time condition, and the like set in the step S9, so that actual shooting is carried out by reading out image signal (Step S10). At this time, image signal is red out by the aforementioned movement shown in FIG. 15. The image signal is stored in the memory 7 by the imaging controller 4.

After that, the microprocessor 9, if required, performs required processing in the image processor 13 or the image compressor 12 on the basis of an instruction of the operating portion 9a, and makes the recorder output the processed signal to store in the recording medium 11a.

In the electronic camera 1 according to the present embodiment, since focal point detection area can be set arbitrary in accordance with the object, it becomes possible to carry out auto focus with high precision, as well as the similar effect of the first embodiment can be obtained.

Instead of disposing all pixels 20 in the effective area to be the pixels 20V, they may be pixels 20H shown in FIG. 12. In this case, in step S4 shown in FIG. 19, the microprocessor 9 sets coordinates of pixel line, in other words, positional coordinates of the row in X-axis direction corresponding to a line sensor for auto focus. In step 7, the microprocessor 9 picks up signals of each pixel in the pixel line of coordinates set in the step S4, in other words, signals of each pixels of the pixel row in X-axis direction, and makes the focal point calculator 10 calculate on the basis of these signals to obtain an amount of defocus.

[Third Embodiment]

Figure 20:
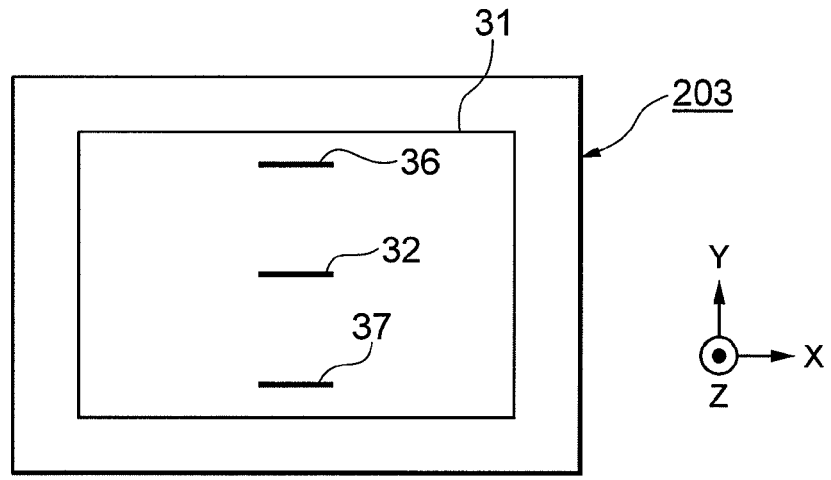
FIG. 20 is a plan view schematically showing a solid-state imaging device of an electronic camera according to a third embodiment of the present invention.
Figure 21:
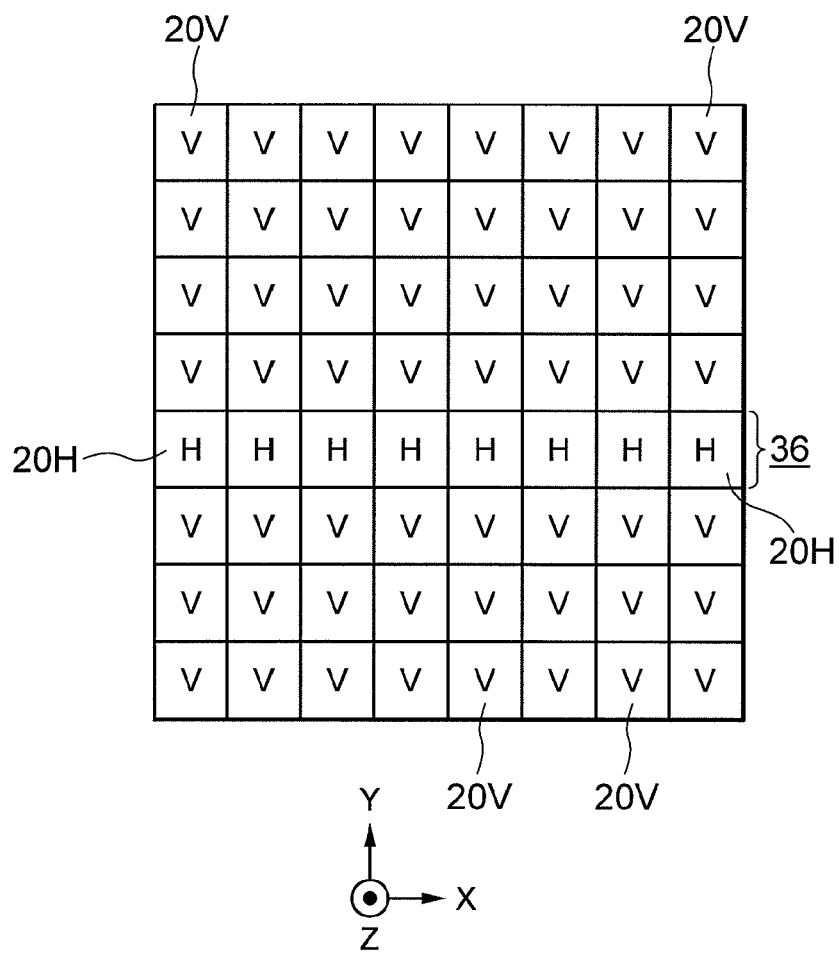
FIG. 21 is an enlarged view enlarging in the vicinity of a focal point detection area shown in FIG. 20.

FIG. 20 is a plan view showing an imaging area 31, in particular, of a solid-state imaging device 203 of an electronic camera according to a third embodiment of the present invention corresponding to FIGS. 3 and 17. FIG. 21 is an enlarged view enlarged any area of an imaging area 36 shown in FIG. 20 corresponding to FIGS. 4 and 18. In FIGS. 20 and 21, the same or similar component as in FIG. 3, 4, 17 or 18 is attached the same symbol to eliminate duplicated explanations.

The point where the present embodiment is different from the first embodiment is that pixels 20 of only the focal point detection areas 32, 36, 37 extending in X direction are pixels 20H shown in FIG. 12, and the rest of pixels 20 are pixels 20V shown in FIGS. 6 through 11.

With the present embodiment, the focal point adjusting state can be detected on the basis of the signal of each pixel of the pixel column in Y-axis direction corresponding to the position of the object similar to the second embodiment, as well as the same effect as the first embodiment can be obtained. In the second embodiment, since only the pixel 20V is used, phase shift amount of pupil division in only Y-axis direction can be detected, so that the focal point adjusting state cannot always be detected with high precision depending on the object. On the other hand, since the pixel 20H is used in the focal point detection areas 32, 36, 37, the phase shift amount in X-axis direction can be detected although it is limited to the focal point detection areas 32, 36, 37. Accordingly, the present embodiment can detect focal point adjusting state with higher precision to various objects to be shot in comparison with the second embodiment.

[Fourth Embodiment]

Figure 22:
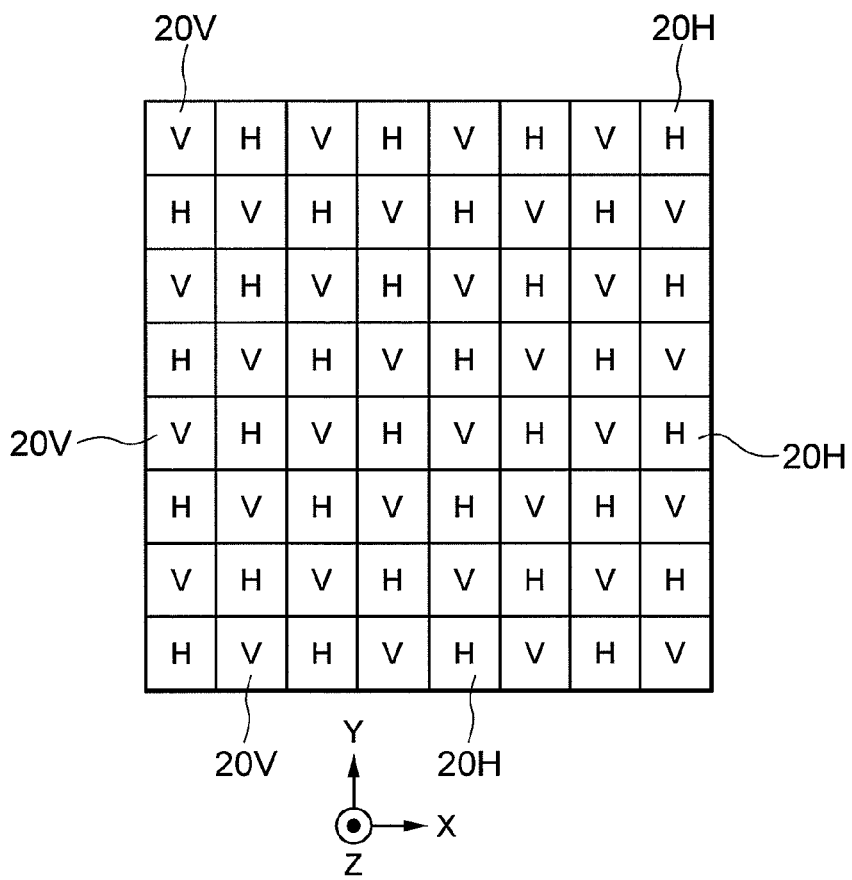
FIG. 22 is an enlarged plan view schematically showing enlarged any portion of the imaging area of a solid-state imaging device of an electronic camera according to a fourth embodiment of the present invention.

FIG. 22 is a partially enlarged plan view schematically showing an arbitral portion of an imaging area of a solid-state imaging device of an electronic camera according to a fourth embodiment of the present invention corresponding to FIGS. 4, 5, 18 and 21.

The point where the present embodiment is different from the first embodiment is only such points that the pixels 20V shown in FIGS. 6 through 11 and the pixels 20H shown in FIG. 12 are disposed checkerwise in all imaging area 31, and basically the same movement as shown in FIG. 19 is carried out.

In the present embodiment, in step S3 shown in FIG. 19, the image processor 13 picks up not only central coordinates but also a longitudinal direction of the object. In step S4, coordinates, in other words, the position and the longitudinal direction of pixel line corresponding to a line sensor for auto focus for focal point detection that is optimum for detecting focal point adjusting state to the object with high precision is set in accordance with the central coordinates and the longitudinal direction of the object picked up in step S3 (step S4). When the direction of the pixel line is Y-direction, the pixel line of alternate pixels 20V is set. When the direction of the pixel line is X-direction, the pixel line of alternate pixels 20H is set. Moreover, in step S7, signals of each pixel of the pixel line having coordinates set in step S4 is picked up, and the focal point calculator 10 calculates the amount of defocus on the basis of the signal.

With the present embodiment, it becomes possible to obtain the similar effect as the first embodiment. In addition to this, since not only the position but also the direction of the focal point detection area can arbitrary be set in accordance with the object to be shot, focal point adjustment states of various objects can be detected with higher precision.

[Variation]

Figure 23:
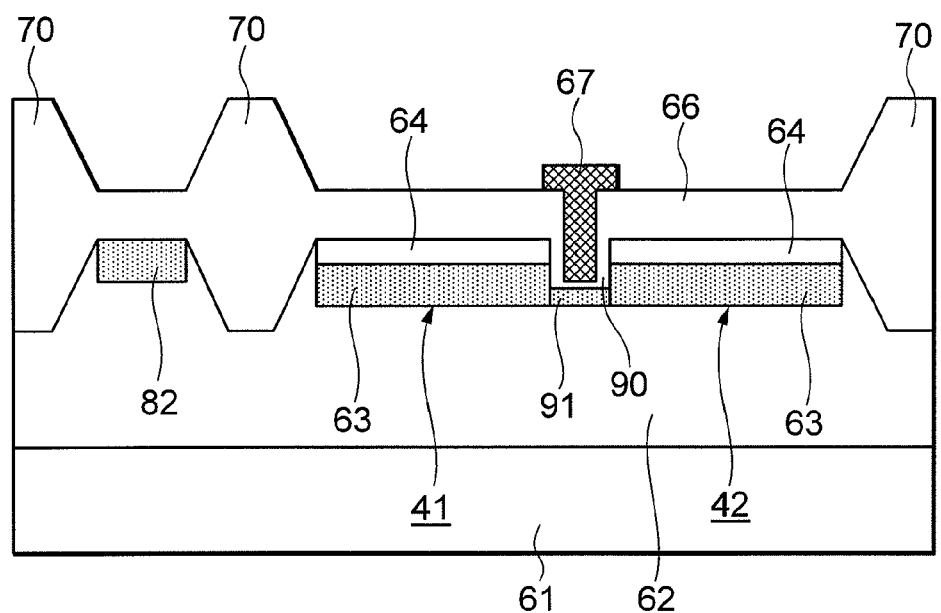
FIG. 23 is a sectional view schematically showing a pixel according to a first variation.
Figure 24:
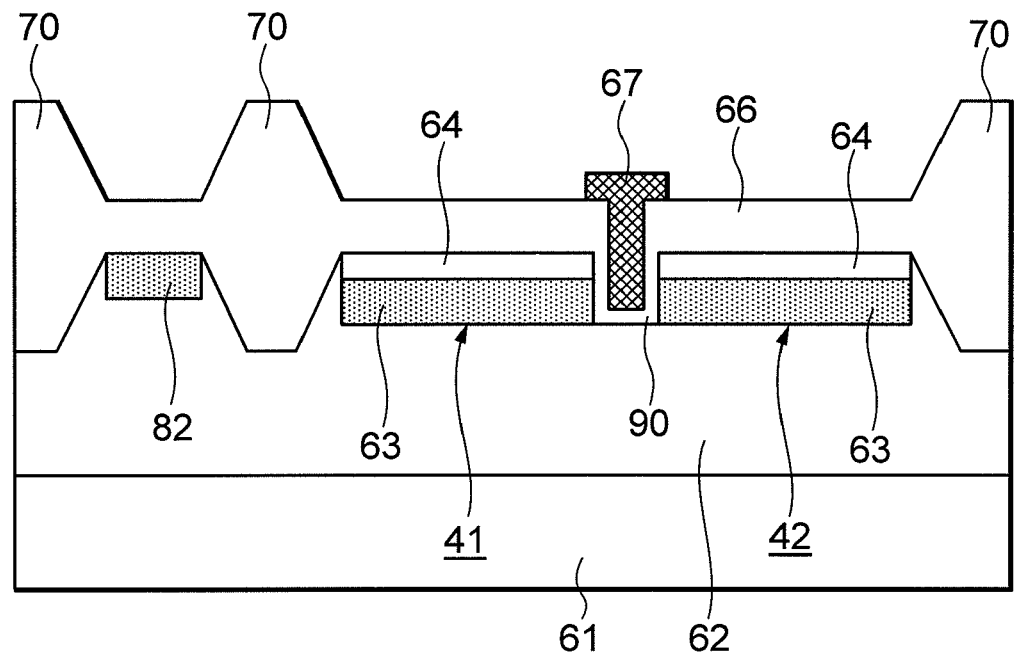
FIG. 24 is a sectional view schematically showing a pixel according to a second variation.

In the above-described each embodiment, for example, instead of the pixel 20V shown in FIGS. 6 through 11, the pixel shown in FIG. 23 or 24 may be used.

FIG. 23 is a sectional view schematically showing a pixel according to a first variation corresponding to FIG. 9. FIG. 24 is a sectional view schematically showing a pixel according to a second variation corresponding to FIG. 9. In FIG. 23 or 24, the same or similar component as in FIG. 9 is attached the same symbol to eliminate duplicated explanations. The point where the pixel shown in FIG. 23 or the pixel shown in FIG. 24 is different from the pixel 20V shown in FIGS. 6 through 11 is only the sectional structure in the vicinity of the gate electrode 67.

In the pixel shown in FIG. 23 or the pixel shown in FIG. 24, a trench is formed on the main surface side of the silicon substrate between pinned photodiodes 41 and 42, and a gate electrode 67 made from polysilicon or ITO is formed in the trench through insulation film 90 made from silicon oxide film. Accordingly, in either pixels shown in FIGS. 23 and 24, the gate electrode 67 intrudes an area of opposing surfaces between one of pinned photodiode 41 and the other of pinned photodiode 42.

In the pixel shown in FIG. 23, an N-type diffusion area 91 having lower impurity level than electric charge storage layer 63 is formed at lower side between N-type electric charge storage layer 63 of the pinned photodiode 41 and N-type electric charge storage layer 63 of the pinned photodiode 42. On the other hand, in the pixel shown in FIG. 24, such N-type diffusion area 91 does not form.

Either of the pixels shown in FIGS. 23 and 24 can be set a state where the pinned photodiodes 41, 42 are electrically connected, or a state where they are electrically divided by changing voltage applied to the gate electrode 67. In either pixels, in the state where they are electrically connected, the lower area of the gate electrode 67 has a photoelectric conversion function, and in the state where they are electrically divided, the lower area of the gate electrode 67 does not have the photoelectric conversion function.

In the pixels shown in FIGS. 23 and 24, since the gate electrode 67 intrudes an area of opposing surfaces between one of pinned photodiode 41 and the other of pinned photodiode 42, it is easy to separate between the pinned photodiodes 41 and 42, so that the length of separation gate can be shortened. Accordingly, there is an effect to be able to make it miniaturize, and the amount of light loss incident on the gate electrode 67 upon shooting can be further reduced, so that sensitivity can be further increased.

Although an embodiment of the present invention is explained above, the present invention is not limited to the embodiments.

For example, in a CMOS type image sensor, although various kinds of pixel structure have been known, the present invention can apply to those image sensors. Moreover, the present invention can apply to various image sensors other than the CMOS type image sensor.

Furthermore, in the present embodiment, although the connection/separation transistors 55 is an MOS transistor that the gate electrode 67 constructs, those may be, for example, a junction-field-effect-transistor (J-FET).

It is needless to say that the above-described each conductive type may be a reversed conductive type. Moreover, in the above-described each embodiment, although an example of a pixel capable of being bisected by one separation line is explained, the present invention may adopt a pixel capable of being divided into three or more by a plurality of separation lines.

Although the above-described each embodiment and variation shows an example that a connection/separation element in a photoelectric converter portion according to the present invention is used as a solid-state imaging device, the connection/separation element in a photoelectric converter portion according to the present invention can be used as, for example, a measurement apparatus using light.

What is claimed is:

1. A solid-state imaging device for photoelectrically converting an object image formed by an image-taking lens, comprising:
a plurality of pixels disposed two-dimensionally;
at least a portion of the pixels each including:
a pair of photoelectric converter portions, each photoelectric converter portion carrying out photoelectric conversion; and
a mode setting member capable of selectively setting a first and a second mode in accordance with a control signal;
the first mode being a mode in which the photoelectric converter portions are electrically connected with each other;
the second mode being a mode in which the photoelectric converter portions are electrically separated from each other;
an area between the photoelectric converter portions having a function to photoelectrically convert incident light in the first mode and not having that function in the second mode, wherein
the photoelectric converter portions are respectively positioned in a first area and a second area of the pixel, the first and second areas being divided in plan view by a dividing line,
each of the photoelectric converter portions having a respective end surface extending along a depth direction of the solid-state imaging device, the end surfaces of the first and second photoelectric converter portions opposing each other, and
the mode setting member including a gate electrode disposed along the dividing line, the gate electrode including a portion that extends along said depth direction and that intrudes into an area between the opposing end surfaces of the photoelectric converter portions.

2. The solid-state imaging device according to claim 1, wherein the gate electrode forms a gate of a MOS transistor that makes a semiconductor area of a respective photoelectric converter portion a source or a drain.

3. The solid-state imaging device according to claim 1, wherein the gate electrode is made of a material having transparency to at least one wavelength range among visible light.

4. The solid-state imaging device according to claim 3, wherein the gate electrode is made of ITO or polysilicon.

5. The solid-state imaging device according to claim 1, wherein a micro-lens for leading light to the photoelectric converter portions is provided to each of the at least a portion of the pixels with a one-to-one correspondence.

6. An imaging apparatus comprising:
the solid-state imaging device according to claim 1;
a signal processor for outputting a detection signal indicating a focal point adjustment state of the image-taking lens based on signals obtained in the second mode from each of selected pixels among the at least a portion of the pixels; and
a lens controller for controlling the focal point adjustment of the image-taking lens based on the detection signal from the signal processor.

7. The solid-state imaging device according to claim 1, wherein said at least a portion of the pixels each further including:
first electric charge storage portions for temporarily storing electric charges generated in and transferred from respective photoelectric converter portions;
a second electric charge storage portion for storing electric charges transferred from said first electric charge storage portions; and
an output portion generating an output signal corresponding to the electric charges stored in said second electric charge storage portion.

8. A solid-state imaging device for photoelectrically converting an object image formed by an image-taking lens, comprising:
a plurality of pixels disposed two-dimensionally for taking the image of the object;
each pixel including:
a pair of photoelectric converter portions, each photoelectric converter portion carrying out photoelectric conversion; and
a mode setting member capable of selectively setting a first and a second mode in accordance with a control signal;
the first mode being a mode for taking the image of the object and in which the photoelectric converter portions are electrically connected with each other;
the second mode being a mode for carrying out automatic focusing and in which the photoelectric converter portions are electrically separated from each other;
an area between the photoelectric converter portions having a function to photoelectrically convert incident light in the first mode and not having that function in the second mode,
wherein the photoelectric converter portions are respectively positioned in a first area and a second area of the pixel, the first and the second areas being divided in plan view by a dividing line,
wherein dividing lines of the plurality of pixels, except a predetermined number of pixels among said plurality of pixels, are oriented in the same direction or in parallel to each other, and
wherein dividing lines of said predetermined number of pixels are perpendicular to the dividing lines of the remaining pixels in the plurality of pixels.

9. A solid-state imaging device for photoelectrically converting an object image formed by an image-taking lens, comprising:
- a plurality of pixels including first pixels and second pixels disposed two-dimensionally for taking the image of the object;
- the second pixels forming groups of pixels, the groups of pixels being arranged in predetermined positions, each group being situated between some of the first pixels;
- each pixel of the first and second pixels including:
  - a pair of photoelectric converter portions, each photoelectric converter portion carrying out photoelectric conversion; and
  - a mode setting member capable of selectively setting a first and a second mode in accordance with a control signal;
  - the first mode being a mode for taking the image of the object and in which the photoelectric converter portions are electrically connected with each other;
  - the second mode being a mode for carrying out automatic focusing and in which the photoelectric converter portions are electrically separated;
  - an area between the photoelectric converter portions having a function to photoelectrically convert incident light in the first mode and not having that function in the second mode,
- wherein the photoelectric converter portions are respectively positioned in a first area and a second area of each pixel, the first and second areas being divided in plan view by a dividing line, and
- the dividing lines of the first pixels and the dividing lines of the second pixels are perpendicular to each other.

10. A solid-state imaging device for photoelectrically converting an object image formed by an image-taking lens, comprising:
- a plurality of pixels including first pixels and second pixels disposed two-dimensionally for taking the image of the object;
- the first pixels and the second pixels being arranged alternately in rows and columns;
- each pixel of the first and the second pixels including:
  - a pair of photoelectric converter portions, each photoelectric converter portion carrying out photoelectric conversion; and
  - a mode setting member capable of selectively setting a first and a second mode in accordance with a control signal;
  - the first mode being a mode for taking the image of the object in which the photoelectric converter portions are electrically connected with each other;
  - the second mode being a mode for carrying out automatic focusing in which the photoelectric converter portions are electrically separated;
  - an area between the photoelectric converter portions having a function to photoelectrically convert incident light in the first mode and not having that function in the second mode,
- wherein the photoelectric converter portions are respectively positioned in a first area and a second area of each pixel, the first and second areas being divided in plan view by a dividing line, and
- wherein the dividing lines of the first pixels and the dividing lines of the second pixels are perpendicular to each other.

11. An imaging apparatus comprising:
the solid-state imaging device according to claim 8;
a signal processor for outputting a detection signal indicating a focal point adjustment state of the image-taking lens based on signals obtained in the second mode from each of selected pixels among the plurality of pixels; and
a lens controller for controlling the focal point adjustment of the image-taking lens based on the detection signal from the signal processor.

12. An imaging apparatus comprising:
the solid-state imaging device according to claim 9;
a signal processor for outputting a detection signal indicating a focal point adjustment state of the image-taking lens based on signals obtained in the second mode from each of selected pixels among the plurality of pixels; and
a lens controller for controlling the focal point adjustment of the image-taking lens based on the detection signal from the signal processor.

13. An imaging apparatus comprising:
the solid-state imaging device according to claim 10;
a signal processor for outputting a detection signal indicating a focal point adjustment state of the image-taking lens based on signals obtained in the second mode from each of selected pixels among the plurality of pixels; and
a lens controller for controlling the focal point adjustment of the image-taking lens based on the detection signal from the signal processor.

* * * * *